(12) United States Patent
Wu

(10) Patent No.: US 9,196,619 B2
(45) Date of Patent: Nov. 24, 2015

(54) SEMICONDUCTOR DEVICE HAVING METAL BIT LINE

(71) Applicant: Nan Wu, Tokyo (JP)

(72) Inventor: Nan Wu, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/313,482

(22) Filed: Jun. 24, 2014

(65) Prior Publication Data
US 2015/0001602 A1  Jan. 1, 2015

(30) Foreign Application Priority Data
Jul. 1, 2013  (JP) .................................. 2013-138086

(51) Int. Cl.
*H01L 29/94* (2006.01)
*H01L 27/108* (2006.01)

(52) U.S. Cl.
CPC .... *H01L 27/10885* (2013.01); *H01L 27/10888* (2013.01); *H01L 27/10894* (2013.01)

(58) Field of Classification Search
CPC ................................................ H01L 27/10888
USPC ............................................................ 257/296
See application file for complete search history.

(56) References Cited

U.S. PATENT DOCUMENTS

| 8,648,415 B2 | 2/2014 | ***Taniguchi |
| 2011/0147834 A1* | 6/2011 | Taniguchi ..................... 257/330 |

FOREIGN PATENT DOCUMENTS

JP  2011-129771  6/2011

* cited by examiner

*Primary Examiner* — Elias M Ullah
(74) *Attorney, Agent, or Firm* — Wells St. John, P.S.

(57) ABSTRACT

Disclosed herein is a device that includes: a semiconductor substrate including a memory cell region and a peripheral circuit region arranged around the memory cell region; an element isolation region formed in the memory cell region and the peripheral circuit region; a cell active region defined by the element isolation region formed in the memory cell region; a first interlayer insulation film disposed on the cell active region, the first interlayer insulation film having a bit contact hole passing therethrough to expose a portion of an upper surface of the cell active region; and a bit line having a first metal laminated film, the bit line being disposed on the first interlayer insulation film so as to fill the bit contact hole.

19 Claims, 31 Drawing Sheets

SEMICONDUCTOR DEVICE HAVING METAL BIT LINE

BACKGROUND OF THE INVENTION

The present invention relates to a semiconductor device and a method of manufacturing the semiconductor device.

As one of semiconductor devices, there is DRAM (Dynamic Random Access Memory) that includes a memory cell section which contains word lines and bit lines, and a peripheral circuit section which is arranged around the memory cell section and drives memory cells of the memory cell section.

In order to respond to demands for miniaturization, the DRAM employs a structure in which the word lines that select the memory cells are embedded in a semiconductor substrate and the bit lines are formed on the semiconductor substrate (For example, see Japanese Patent Application Laid-open No. 2011-129771).

Japanese Patent Application Laid-open No. 2011-129771 discloses a method of forming at once gate electrodes of planar transistors in a peripheral circuit region along with bit lines when the bit lines are formed in a memory cell region.

More specifically, first, a laminated film is formed as a high-concentration n-type impurity implantation polysilicon film, a metal film and a silicon nitride film are laminated on both the memory cell region and the peripheral circuit region.

The high-concentration n-type impurity implantation polysilicon film and metal film formed on the memory cell region are conductive films that are used as base material of the bit lines. The high-concentration n-type impurity implantation polysilicon film and metal film formed on the peripheral circuit region are conductive films that are used as base material of the gate electrodes of planar transistors, which are disposed in the peripheral circuit region.

After that, the photolithographic and dry-etching techniques are used to perform patterning of the laminated film. As a result, the bit lines that are disposed on the memory cell region, and the gate electrodes of the planar transistors that are disposed on the peripheral circuit region are formed at once.

In the case of Japanese Patent Application Laid-open No. 2011-129771, the bit lines and the gate electrodes of the planar transistors disposed in the peripheral circuit region employ a poly-metal gate structure.

The poly-metal gate structure is made up of a polysilicon film and a metal film, which is laminated on the polysilicon film.

FIG. 15 is a cross-sectional view illustrating a process of manufacturing a structure (or a structure containing bit lines) that is disposed on the memory cell region. FIG. 15 is an enlarged cross-sectional view of a portion in which a bit line contact plug 306 and a bit line 321 are placed, in a memory cell section 300 that is disposed in the memory cell region.

FIG. 16 is across-sectional view illustrating a process of manufacturing a structure (or a structure containing gate electrodes of planar transistors) that is disposed on the peripheral circuit region. FIG. 16 is an enlarged cross-sectional view of a region in which a gate electrode 335 of a planar transistor is placed, in a peripheral circuit section 330 that is disposed in the peripheral circuit region. In FIG. 16, the same components as those of the memory cell section 300 shown in FIG. 15 are represented by the same reference symbols.

With reference to FIG. 15, a method of manufacturing the memory cell section 300 disposed in the memory cell region will be described.

First, the well-known photolithographic and dry-etching techniques are used to form a bit contact hole 304A: the bit contact hole 304A passes through a bit-contact interlayer insulation film 304, which covers an upper surface of an active region 301 and an upper surface of an element isolation region 302 defining the active region 301 (cell active region), and the bit contact hole 304A exposes the upper surface of the active region 301.

Then, a well-known technique is used to fill the bit contact hole 304A with polysilicon film. As a result, what is formed is a bit line contact plug 306 that is made of the polysilicon film and whose lower end is in contact with the upper surface of the active region 301.

Then, a well-known technique is used to sequentially laminate a Poly-Si film 308, which covers an upper end surface of the bit line contact plug 306 and an upper surface of the bit-contact interlayer insulation film 304, a metal laminated film 309, and a silicon nitride film 312.

The metal laminated film 309 is formed by sequentially laminating a TiSi film 314, a TiN film 315, a WSi film 316, and a W film 317.

Then, a well-known technique is used to perform patterning of the silicon nitride film 312. As a result, what is formed is a cap insulation film 319 that is made of the silicon nitride film 312 and which covers an upper surface of the W film 317 corresponding to a formation region of the bit line 321.

Then, the cap insulation film 319 is used as an etching mask, and patterning of the Poly-Si film 308 and the metal laminated film 309 by anisotropic dry etching is performed. As a result, what is formed is the bit line 321 that is made up of the Poly-Si film 308 and the metal laminated film 309.

Then, a well-known technique is used to form a sidewall 323 that covers a side surface of the bit line 321 and a side surface of the cap insulation film 319.

Then, a well-known technique is used to form a capacitance-contact interlayer insulation film 325, which fills the space formed between adjacent sidewalls 323. In this manner, the memory cell section 300 is produced.

With reference to FIG. 16, a method of manufacturing the peripheral circuit section 330 disposed in the peripheral circuit region will be described.

First, a well-known technique is used to form a gate insulation film 333 on an active region 331 (or an active region where a peripheral-circuit transistor is formed) that is located in the peripheral circuit region.

Then, on an upper surface of the gate insulation film 333, a step-reduction Poly-Si film 334, a Poly-Si film 308, a metal laminated film 309, and a silicon nitride film 312 are sequentially laminated.

Incidentally, the Poly-Si film 308, the metal laminated film 309, and the silicon nitride film 312 are formed at the same time for the peripheral circuit region and the memory cell region.

Then, a well-known technique is used to perform patterning of the silicon nitride film 312. As a result, what is formed is a cap insulation film 319 that is made of the silicon nitride film 312 and which covers an upper surface of the W film 317 corresponding to a formation region of the gate electrode 335 of the planar transistor.

Then, the cap insulation film 319 is used as an etching mask, and patterning of the step-reduction Poly-Si film 334, the Poly-Si film 308, and the metal laminated film 309 by anisotropic dry etching is performed. As a result, what is formed is the gate electrode 335 that is made up of the step-reduction Poly-Si film 334, the Poly-Si film 308, and the metal laminated film 309. The gate electrode 335 is formed at the same time as the bit line 321, which is disposed in the memory cell region, is formed.

After that, a well-known technique is used to form an interlayer insulation film 337, which fills the space between the gate electrodes 335. In this manner, the peripheral circuit section 330 is formed.

The step-reduction Poly-Si film 334 is a film that is designed to offset a difference in height between the bit line 321 and the gate insulation film 333 disposed in the peripheral circuit region, which is caused by a step that is equal in thickness to the bit-contact interlayer insulation film 304 between the memory cell region and the peripheral circuit region.

The bit line 321 is made up of the Poly-Si film 308 and metal laminated film 309 that are laminated. The gate electrode 335 disposed in the peripheral circuit region is made up of the step-reduction Poly-Si film 334, Poly-Si film 308, and metal laminated film 309 that are laminated.

The problem is that the use of Poly-Si film (i.e. the Poly-Si film 308 and the step-reduction Poly-Si film 334), which is higher in resistance than metal, leads to an increased wiring resistance as the miniaturization goes on. In particular, this problem becomes conspicuous when the Poly-Si film 308 is used in the bit line 321.

SUMMARY

In one embodiment, there is provided a semiconductor device that includes: a semiconductor substrate including a memory cell region and a peripheral circuit region arranged around the memory cell region; an element isolation region formed in the memory cell region and the peripheral circuit region; a cell active region defined by the element isolation region formed in the memory cell region; a first interlayer insulation film disposed on the cell active region, the first interlayer insulation film having a bit contact hole passing therethrough to expose a portion of an upper surface of the cell active region; and a bit line having a first metal laminated film, the bit line being disposed on the first interlayer insulation film so as to fill the bit contact hole.

According to the semiconductor device of the present invention, a first interlayer insulation film is formed so as to cover an upper surface on a cell active region and an upper surface of a silicon film. Then, anisotropic dry etching is performed to form a bit contact hole that passes through the first interlayer insulation film and exposes a portion of the upper surface of the cell active region, as well as to remove the first interlayer insulation film disposed on the silicon film. Then, a metal laminated film, which covers an upper surface of the first interlayer insulation film and an upper surface of the silicon film, is formed so as to fill the bit contact hole. Then, patterning of the metal laminated film and the silicon film is performed. As a result, a bit line, which is made of the metal laminated film and fills the bit contact hole, and a gate electrode of a peripheral circuit transistor, which is made up of the metal laminated film and a step-reduction silicon film, are formed at once. Therefore, without the use of a bit line contact plug made of silicon film, the bit line, which is made of the metal laminated film (i.e., the bit line that does not contain, among its components, a silicon film that is higher in resistance than metal), can be connected directly to the cell active region (or an active region where an impurity diffusion region is formed).

Therefore, even if the memory cell section is miniaturized (or if the diameter of the opening of the bit contact hole is made smaller), a rise in the resistance of the bit line is curbed.

Moreover, on the main surface of the semiconductor substrate that corresponds to the peripheral circuit region, an insulation film, which serves as base material of the peripheral circuit gate insulation film, a silicon film, which serves as base material of the step-reduction silicon film, and the first interlayer insulation film are sequentially formed. Then, in the first interlayer insulation film, the bit contact hole is formed so as to expose the upper surface of the cell active region, and the first interlayer insulation film formed in the peripheral circuit region is removed. Then, the metal laminated film, which covers the upper surface of the first interlayer insulation film and the upper surface of the silicon film, is formed so as to fill the bit contact hole. Then, patterning of the metal laminated film and the silicon film is performed. As a result, the bit line, which is made of the metal laminated film, and the gate electrode of the peripheral circuit transistor, which is made up of the metal laminated film and the step-reduction silicon film, are formed at once. In this manner, the thickness of the bit line disposed on the first interlayer insulation film can be reduced by an amount equivalent to the thickness of the step-reduction silicon film.

Therefore, the parasitic capacitance of the bit line can be reduced. Thus, it is possible to increase the accuracy of the operation of the semiconductor device (or, more specifically, the accuracy of the operation of DRAM, for example).

Furthermore, when the bit contact hole is formed, the first interlayer insulation film disposed above the peripheral circuit region is removed. Therefore, there is no need to separately provide a step of removing the first interlayer insulation film disposed above the peripheral circuit region. Thus, it is possible to reduce the number of manufacturing steps for the semiconductor device.

Moreover, in planar view, the area of the silicon film disposed above the peripheral circuit region is quite large. Therefore, when the bit contact hole is formed by anisotropic dry etching, the time when the silicon film becomes exposed can be easily detected as an end point of etching following the disappearance of the first interlayer insulation film disposed above the peripheral circuit region.

BRIEF DESCRIPTION OF THE DRAWINGS

FIG. 110A is a cross-sectional view indicative of one process of the method of manufacturing the semiconductor device taken along the line A-A shown in FIG. 1;

FIG. 110B is a cross-sectional view indicative of the one process of the method of manufacturing the semiconductor device taken along the line B-B shown in FIG. 1;

DETAILED DESCRIPTION OF THE EMBODIMENTS

Hereinafter, an embodiment of the present invention will be described in detail with reference to the accompanying drawings. Incidentally, for ease of explanation, some of the drawings used in the following description are enlarged views of characteristic portions in order to make the characteristics easy-to-understand; dimensions, proportions, and other factors of each component are not necessarily identical to those of actual components.

The materials, dimensions and other factors illustrated below are one example. The present invention is not necessarily limited to them. The present invention may be appropriately modified and embodied without changing the subject matter of the invention.

(Embodiment)

Figure 1:
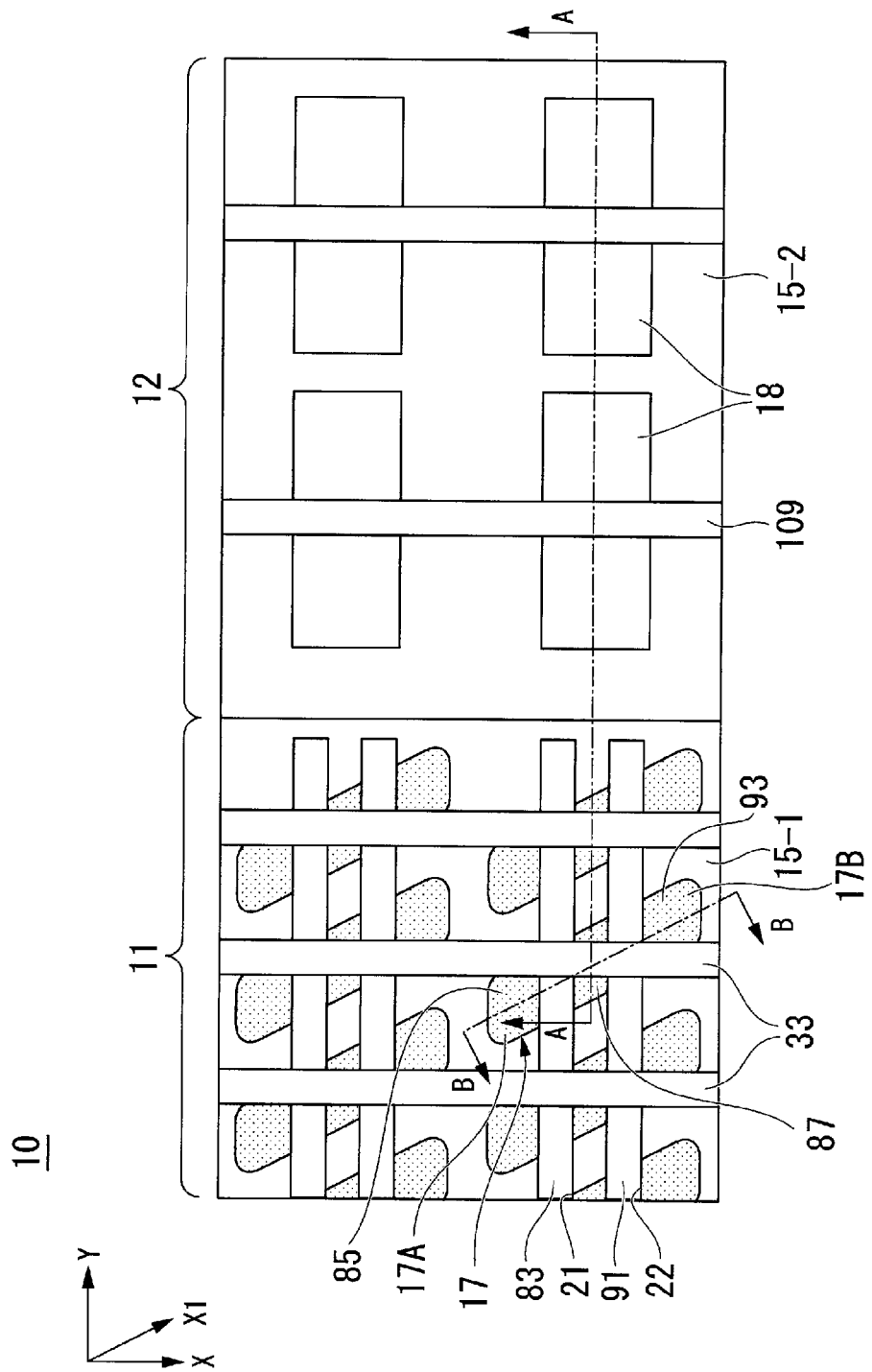
FIG. 1 is a schematic plan view indicative of a schematic configuration of a semiconductor device according to an embodiment of the present invention.

Referring now to FIG. 1, the positional relationship between element isolation regions 15-1 and 15-2, cell active regions 17, peripheral active regions 18, first and second grooves 21 and 22, embedded gate electrodes 83 and 91, bit lines 33, and gate electrodes 109 of components included in the semiconductor device 10 of the present embodiment is shown.

Accordingly, the only things that are shown in FIG. 1 are the element isolation regions 15-1 and 15-2, the cell active regions 17, the peripheral active regions 18, the first and second grooves 21 and 22, the embedded gate electrodes 83 and 91, the bit lines 33, and the gate electrodes 109 of the components included in the semiconductor device 10 of the present embodiment. The other components included in the semiconductor device 10 are not shown in FIG. 1.

As one example of the semiconductor device 10 of the present embodiment, FIGS. 1 to 5 show DRAM (Dynamic Random Access Memory). In FIGS. 1 to 5, the same components are represented by the same reference symbols.

In FIGS. 1 to 5, an X-direction indicates a direction in which the bit lines 33 and the gate electrodes 109 (or gate electrodes of peripheral circuit transistors 41) extend. A Y-direction indicates a direction in which the first and second grooves 21 and 22 and the embedded gate electrodes 83 and 91 extend.

In FIGS. 1 to 5, an X1-direction indicates a direction in which the cell active regions 17 extend. A Z-direction indicates a thickness direction of a semiconductor substrate 13.

With reference to FIGS. 1 to 5, the semiconductor device 10 of the present embodiment includes a memory cell section 11, which is provided in a memory cell region E; and a peripheral circuit section 12, which is provided in a peripheral circuit region F that is located around the memory cell section 11.

The semiconductor device 10 includes the semiconductor substrate 13; the element isolation regions 15-1 and 15-2; the cell active regions 17; the peripheral active regions 18; the first and second grooves 21 and 22 (two grooves); first and second transistors 25 and 26; embedded insulation films 27; a first interlayer insulation film 28; bit contact holes 28A; the bit lines 33; cover insulation films 34-1 and 34-2; sidewalls 36-1 and 36-2; peripheral circuit transistors 41; a second interlayer insulation film 43; first contact holes 45 and 46; second contact holes 48; capacitance contact plugs 51 and 52; first contact plugs 53; first wiring patterns 55; stopper films 57; a third interlayer insulation film 59; cylinder holes 62; capacitors 64; first and second memory cells MC1 and MC2; a fourth interlayer insulation film 66; third contact holes 68; second contact plugs 71; second wiring patterns 73; and a protective insulation film 75.

The semiconductor substrate 13 is a plate-like substrate. The semiconductor substrate 13 includes the memory cell region E and the peripheral circuit region F, which is located around the memory cell region E.

For example, the semiconductor substrate 13 may be a p-type single crystal silicon substrate, a n-type single crystal silicon substrate, a TFT silicon substrate, or the like.

Hereinafter, as one example of the semiconductor substrate 13, the case where the p-type single crystal silicon substrate is used will be described.

The element isolation regions 15-1 are formed in the memory cell region E of the semiconductor substrate 13 to define a plurality of cell active regions 17. The element isolation regions 15-1 include first portions, which extend in the X1-direction and are arranged at predetermined intervals in the Y-direction; and second portions, which extend in the Y-direction and are arranged at predetermined intervals in the X-direction.

The element isolation regions 15-1 include a first element isolation groove (not shown), which is disposed in the memory cell region E; and a first element isolation insulation film (not shown), which fills the first element isolation groove and whose upper surface is flush with a main surface 13a of the semiconductor substrate 13.

The depth of the first element isolation groove (not shown) relative to the main surface 13a of the semiconductor substrate 13 is configured so as to be deeper than the depth of the first and second grooves 21 and 22.

For example, the first element isolation insulation film (not shown) may be a silicon oxide film ($SiO_2$ film), a silicon nitride film (SiN film), a laminated film of those films, or the like.

The element isolation regions 15-2 are formed in the peripheral circuit region F of the semiconductor substrate 13 to define a plurality of peripheral active regions 18. The element isolation regions 15-2 include first portions, which extend in the X-direction and are arranged at predetermined intervals in the Y-direction; and second portions, which extend in the Y-direction and are arranged at predetermined intervals in the X-direction.

The element isolation regions 15-2 include a second element isolation groove (not shown), which is disposed in the peripheral circuit region F; and a second element isolation insulation film (not shown), which fills the second element isolation groove and whose upper surface is flush with the main surface 13a of the semiconductor substrate 13.

The element isolation regions 15-1 and 15-2 can be formed at once.

The depth of the second element isolation groove (not shown) relative to the main surface 13a of the semiconductor substrate 13 may be equal to the depth of the first element isolation groove (not shown) formed in the memory cell region E.

The second element isolation insulation film (not shown) may be made of the same insulation film as that of the first element isolation insulation film (not shown).

The cell active regions 17 are regions of the semiconductor substrate 13 that are defined by the element isolation regions 15-1. One cell active region 17 is defined by two first portions (which are two of the above first portions included in the element isolation regions 15-1) that are arranged adjacent to each other in the Y-direction, and two second portions (which are two of the above second portions included in the element isolation regions 15-1) that are arranged adjacent to each other in the X-direction. Therefore, the cell active region 17 extends in the X1-direction.

A plurality of cell active regions 17 are disposed at predetermined intervals in the X1- and Y-directions. In each of the cell active regions 17, the first and second transistors 25 and 26 are placed (i.e., the two transistors are placed in each of the cell active regions 17).

For example, the distance between the cell active regions 17 that are disposed adjacent to each other in the Y-direction may be equal to the width of the Y-direction cell active regions 17, or may be smaller; the distance is not particularly limited.

Incidentally, as one example of the shape of the cell active regions 17, FIG. 1 shows a parallelogram that has the long sides in the X1-direction and whose corners have been rounded. However, the shape of the cell active regions 17 is not limited to this shape. For example, as the shape of the cell active regions 17, a parallelogram may be used.

The peripheral active regions 18 are regions of the semiconductor substrate 13 that are defined by the element isolation regions 15-2. One peripheral active region 18 is defined by two first portions (which are two of the above first portions included in the element isolation regions 15-2) that are arranged adjacent to each other in the Y-direction, and two second portions (which are two of the above second portions included in the element isolation regions 15-2) that are arranged adjacent to each other in the X-direction. Therefore, the peripheral active region 18 extends in the Y-direction.

A plurality of peripheral active regions 18 are disposed at predetermined intervals in the X- and Y-directions. In each of the peripheral active regions 18, one peripheral circuit transistor 41 is placed.

Incidentally, the shape, number, arrangement, and other factors of the peripheral active regions 18 shown in FIG. 1 are one example. The peripheral active regions 18 are not limited to this example.

The first and second grooves 21 and 22 extend in the Y-direction, and are provided in the memory cell region E of the semiconductor substrate 13. The first and second grooves 21 and 22 are disposed so as to divide an upper portion of one cell active region 17 into three.

The first and second grooves 21 and 22 are placed in such a way as to go over a plurality of cell active regions 17 arranged in the Y-direction, and the element isolation regions 15-1 disposed between the cell active regions 17.

The depth of the first and second grooves 21 and 22 relative to the main surface 13a of the semiconductor substrate 13 is configured so as to be smaller than the depth of the element isolation regions 15-1 and 15-2. The depth of the first and second grooves 21 and 22 is 150 nm, for example.

The first and second transistors 25 and 26 are cell transistors (selection transistors), and are provided in the cell active regions 17. One first transistor 25 and one second transistor 26 are provided in the same cell active region 17. The first and second transistors 25 and 26 are placed adjacent to each other in the direction (X1-direction) in which the cell active regions 17 extend.

The first transistor 25 includes a gate insulation film 81, an embedded gate electrode 83, a first capacitance impurity diffusion region 85, and a bit line impurity diffusion region 87.

The gate insulation film 81 is placed in such a way as to cover an inner surface of the first groove 21 formed in the cell active region 17.

For example, the gate insulation film 81 may be a single-layer silicon oxide film ($SiO_2$ film), a silicon oxynitride film (SiON film), a laminated silicon oxide film ($SiO_2$ film), a laminated film made by laminating a silicon nitride film (SiN film) on a silicon oxide film ($SiO_2$ film), or the like.

The embedded gate electrode 83 is placed in such a way as to fill a lower portion of the first groove 21 through the gate insulation film 81.

As a metal film that constitutes the embedded gate electrode 83, for example, a laminated film made by sequentially laminating a titanium nitride film (TiN film) and a tungsten film (W film) may be used.

The first capacitance impurity diffusion region 85 is disposed in one end portion 17A of a cell active region 17 that is located between an upper portion of the first groove 21 and the element isolation region 15-1 (i.e., in the cell active region 17 that makes up one side surface of the first groove 21 (In FIG. 3, the side surface of the first groove 21 that is closer to the element isolation region 15-1)). The first capacitance impurity diffusion region 85 functions as a source/drain region of the first transistor 25.

If the depth of the first groove 21 is 150 nm and the Z-direction height of the embedded gate electrode 83 is 80 nm, the depth of the first capacitance impurity diffusion region 85 relative to the main surface 13a of the semiconductor substrate 13 may be 70 nm, for example.

The bit line impurity diffusion region 87 is placed in a central portion of the cell active region 17 that is located between an upper portion of the first groove 21 and an upper portion of the second groove 22 (i.e., in the cell active region 17 that makes up the other side surface of the first groove 21 (In FIG. 3, the side face of the first groove 21 that is closer to the second groove 22)).

The bit line impurity diffusion region 87 functions a common impurity diffusion region (source/drain region) for the first and second transistors 25 and 26 that are placed in the cell active region 17 (or the same active region).

If the depth of the first and second grooves 21 and 22 is 150 nm and the Z-direction height of the embedded gate electrode 83 is 80 nm, the depth of the bit line impurity diffusion region 87 relative to the main surface 13a of the semiconductor substrate 13 may be 70 nm, for example.

If the semiconductor substrate 13 is a p-type single crystal silicon substrate, the first capacitance impurity diffusion region 85 and the bit line impurity diffusion region 87 may be n-type impurity diffusion regions, for example.

The second transistor 26 includes a gate insulation film 81, an embedded gate electrode 91, a second capacitance impurity diffusion region 93, and a bit line impurity diffusion region 87.

The gate insulation film 81 is placed in such a way as to cover an inner surface of the second groove 22 formed in the cell active region 17.

The embedded gate electrode 91 is placed in such a way as to fill a lower portion of the second groove 22 through the gate insulation film 81.

As a metal film that constitutes the embedded gate electrode 91, for example, the same metal film that constitutes the embedded gate electrode 83 may be used.

The second capacitance impurity diffusion region 93 is disposed in the other end portion 17B of a cell active region 17 that is located between an upper portion of the second groove 22 and the element isolation region 15-1 (i.e., in the cell active region that makes up one side surface of the second groove 22 (In FIG. 3, the side surface of the second groove 22 that is closer to the element isolation region 15-1)). The second capacitance impurity diffusion region 93 functions as a source/drain region of the second transistor 26.

If the depth of the second groove 22 is 150 nm and the Z-direction height of the embedded gate electrode 91 is 80 nm, the depth of the second capacitance impurity diffusion region 93 relative to the main surface 13a of the semiconductor substrate 13 may be 70 nm, for example.

If the semiconductor substrate 13 is a p-type single crystal silicon substrate, the second capacitance impurity diffusion region 93 may be a n-type impurity diffusion region, for example.

The embedded insulation films 27 are placed so as to fill upper portions of the first and second grooves 21 and 22. Therefore, an upper surface of the embedded gate electrode 83 placed in the lower portion of the first groove 21, and an upper surface of the embedded gate electrode 91 placed in the lower portion of the second groove 22 are covered with the embedded insulation films 27, respectively. The upper surfaces of the embedded insulation films 27 are flush with the main surface 13a of the semiconductor substrate 13.

For example, each of the embedded insulation films 27 may be a silicon oxide film ($SiO_2$ film), a silicon nitride film (SiN film), a laminated film of those films, or the like.

The first interlayer insulation film 28 is provided in the memory cell region E (including the cell active region 17). The first interlayer insulation film 28 is placed in such a way as to cover an upper surface of the element isolation region 15-1 and upper surfaces of the embedded insulation films 27.

For example, the first interlayer insulation film 28 may be a silicon oxide film ($SiO_2$ film) formed by CVD (Chemical Vapor Deposition) method, or a coating-type insulation film (silicon oxide film ($SiO_2$ film)) formed by SOG (Spin On Glass) method.

The bit contact hole 28A is provided in the first interlayer insulation film 28 in such away as to pass through the first interlayer insulation film 28 located on the bit line impurity diffusion region 87 and to expose an upper surface 87a of the bit line impurity diffusion region 87 (or part of the upper surface 17a of the cell active region 17).

The bit line 33 is placed on the first interlayer insulation film 28 in such a way as to fill the bit contact hole 28A and extend in the X-direction.

Therefore, a lower end of the bit line 33 is connected directly to the upper surface 87a of the bit line impurity diffusion region 87 (or the surface that is flush with the main surface 13a of the semiconductor substrate 13 and the upper surface 17a of the cell active region 17).

The bit line 33 is made of a first metal laminated film 97-1, which does not contain any film other than metal film (e.g. a silicon film or the like that is higher in resistance than the metal film).

In that manner, without using a bit line contact plug made of silicon film, the bit line 33, which is made of the first metal laminated film 97-1 (i.e., the bit line that does not contain, among its components, a silicon film that is higher in resistance than metal), can be connected directly to the bit line impurity diffusion region 87 formed in the cell active region 17.

Therefore, even if the memory cell section 11 is miniaturized (or if the diameter of the opening of the bit contact hole 28A is made smaller), a rise in the resistance of the bit line 33 is curbed.

In the first metal laminated film 97-1, a metal silicide film 101, a titanium nitride film 102, a tungsten silicide film 103, and a tungsten film 104 are sequentially laminated.

The metal silicide film 101 is a metal film that is placed on the bottom layer, among the metal films that make up the first metal laminated film 97-1. The metal silicide film 101 is placed so as to cover the upper surface 87a of the bit line impurity diffusion region 87, which is exposed via the bit contact hole 28A. For example, the metal silicide film 101 may be a titanium silicide film.

In this manner, the metal silicide film 101, which is placed on the bottom layer of the first metal laminated film 97-1 that constitutes the bit line 33, is placed in such a way as to cover the upper surface 87a of the bit line impurity diffusion region 87, which is exposed via the bit contact hole 28A. Therefore, it is possible to lower the contact resistance between the bit line 33 and the bit line impurity diffusion region 87 (or the impurity diffusion region made of single crystal silicon containing n-type impurities).

The thickness of each of the films that make up the first metal laminated film 97-1 may be as follows: the metal silicide film 101 is 5 nm, the titanium nitride film 102 is 10 nm, the tungsten silicide film 103 is 2 nm, and the tungsten film 104 is 20 nm.

In this case, if the opening diameter of the bit contact hole 28A is 30 nm and the depth thereof is 20 nm, the bit contact hole 28A is filled with the metal silicide film 101, the titanium nitride film 102, and the tungsten silicide film 103.

If the opening diameter of the bit contact hole 28A is reduced to 20 nm or less, the bit contact hole 28A is filled with the metal silicide film 101 and the titanium nitride film 102. In either case, the metal laminated film placed on the first interlayer insulation film 28 is made up of the three-layer films, or the titanium nitride film 102, the tungsten silicide film 103, and the tungsten film 104.

Incidentally, in the present embodiment, the film in which the metal silicide film 101, the titanium nitride film 102, the tungsten silicide film 103, and the tungsten film 104 are sequentially laminated is described as one example of the first metal laminated film 97-1. However, the metal films that make up the first metal laminated film 97-1 are not limited to those films; the metal films may be appropriately selected.

The cover insulation film 34-1 is disposed so as to cover an upper surface of the bit line 33. An upper surface of the cover insulation film 34-1 is flat. The cover insulation film 34-1 protects the upper surface of the bit line 33, and functions as an etching mask when patterning is performed by anisotropic dry etching of a metal laminated film (or a metal laminated film 97 shown in FIG. 10A, described later), which serves as base material of the bit line 33. The film used as base material of the cover insulation film 34-1 may be a silicon nitride film (SiN film), for example.

The cover insulation film 34-2 is disposed so as to cover an upper surface of the gate electrode 109 that is part of the peripheral circuit transistor 41. The upper surface of the cover insulation film 34-2 is flat. The cover insulation film 34-2 protects the upper surface of the gate electrode 109, and functions as an etching mask when patterning is performed by anisotropic dry etching of a metal laminated film (or the metal laminated film 97 shown in FIG. 10A, described later), which serves as base material of the gate electrode 109.

The film used as base material of the cover insulation film 34-2 may be a silicon nitride film (SiN film), for example.

The sidewalls 36-1 are disposed so as to cover side surfaces of the bit line 33 and side surfaces of the cover insulation film 34-1.

The sidewalls 36-2 are disposed so as to cover side surfaces of the gate electrode 109 that is part of the peripheral circuit transistor 41, and side surfaces of the cover insulation film 34-2. The Y-direction width of each of the sidewall 36-2 is equal to the Y-direction width of a low-concentration impurity diffusion region 112.

The sidewalls 36-2 function as a mask when a pair of high-concentration impurity diffusion regions 113 is formed in the peripheral active region 18 by ion implantation method.

The insulation film that constitutes the sidewalls 36-1 and 36-2 may be a silicon nitride film (SiN film), for example.

The peripheral circuit transistor 41 is a planar transistor provided in the peripheral active region 18. The peripheral circuit transistor 41 includes a peripheral circuit gate insulation film 108, a gate electrode 109, a pair of low-concentration impurity diffusion regions 112, and a pair of high-concentration impurity diffusion regions 113.

The peripheral circuit gate insulation film 108 is placed at the center of an upper surface 18a (or a surface that is flush with the main surface 13a of the semiconductor substrate 13 located in the peripheral circuit region F) of the peripheral active region 18.

For example, the peripheral circuit gate insulation film 108 may be a high dielectric constant film (High-K film) that has a dielectric constant of 3.9 or more and which is higher than the relative permittivity of a thermally-oxidized film. For example, the high dielectric constant film (High-K film) may be an insulation film containing hafnium oxide, tantalum oxide, lanthanum oxide, or the like.

In that manner, as the peripheral circuit gate insulation film 108, the high dielectric constant film (High-K film), which has a dielectric constant of 3.9 or more and which is higher than the relative permittivity of a thermally-oxidized film, is used. Therefore, even if the semiconductor device 10 is miniaturized, it is possible to reduce leakage current, as well as to increase the amount of current of the peripheral circuit gate insulation film 108.

The gate electrode 109 is placed on an upper surface of the peripheral circuit gate insulation film 108. In the gate electrode 109, a step-reduction silicon film 115 and a second metal laminated film 97-2 are sequentially laminated.

The step-reduction silicon film 115 is disposed in such a way as to cover the upper surface of the peripheral circuit gate insulation film 108. For example, the step-reduction silicon film 115 may be a polysilicon film.

An upper surface of the step-reduction silicon film 115 is flush with an upper surface of the first interlayer insulation film 28 disposed in the memory cell region E. The thickness of the step-reduction silicon film 115 is 20 nm, for example.

The second metal laminated film 97-2 has the same laminated structure as the first metal laminated film 97-1 that makes up the bit line 33 described above. That is, in the second metal laminated film 97-2, a metal silicide film 101, a titanium nitride film 102, a tungsten silicide film 103, and a tungsten film 104 are sequentially laminated.

In the gate electrode 109, the step-reduction silicon film 115, which is one layer of polysilicon film, and the second metal laminated film 97-2 are laminated.

Figure 16:
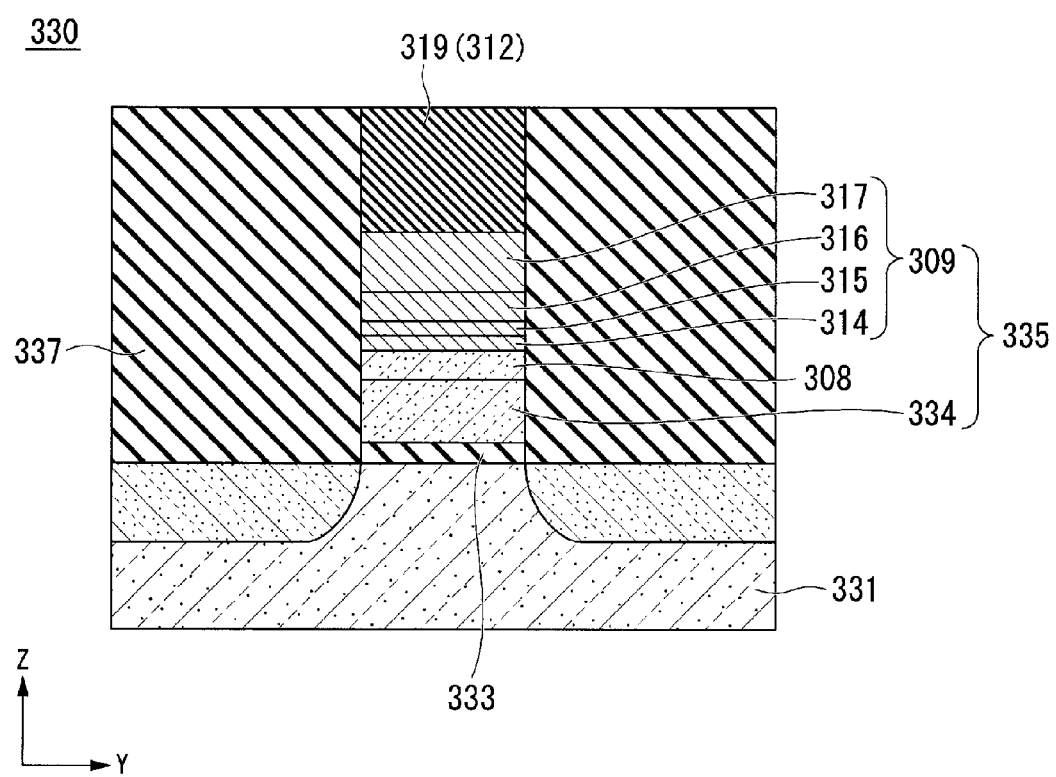
FIG. 16 is across-sectional view illustrating a process of manufacturing a structure (or a structure containing gate electrodes of planar transistors) that is disposed on the peripheral circuit region.

Accordingly, compared with the gate electrode 335 shown in FIG. 16 that includes two layers of polysilicon film (i.e., the step-reduction Poly-Si film 334 and the Poly-Si film 308), the gate electrode 109 has a smaller resistance value.

Incidentally, as one example, FIG. 1 shows the gate electrode 109 that extends in the X-direction in such a way as to traverse longitudinally through the center of the peripheral active regions 18. However, the layout of the gate electrode 109 is not limited to this.

The pair of low-concentration impurity diffusion regions 112 is placed in the peripheral active region 18 on both sides of the peripheral circuit gate insulation film 108 in such a way that the peripheral circuit gate insulation film 108 is sandwiched therebetween in the Y-direction. If the semiconductor substrate 13 is a p-type single crystal silicon substrate, the pair of low-concentration impurity diffusion regions 112 may be low-concentration n-type impurity diffusion regions, for example.

As the pair of low-concentration impurity diffusion regions 112, for example, LDD (Lightly Doped Drain) regions may be used.

The pair of high-concentration impurity diffusion regions 113 is provided in both end portions of the peripheral active region 18 in such a way that the peripheral circuit gate insulation film 108 is sandwiched therebetween through the low-concentration impurity diffusion regions 112.

The depth of the high-concentration impurity diffusion regions 113 relative to the main surface 13a of the semiconductor substrate 13 is configured so as to be deeper than the depth of the low-concentration impurity diffusion regions 112. The high-concentration impurity diffusion regions 113 are higher in impurity concentration than the low-concentration impurity diffusion regions 112.

If the semiconductor substrate 13 is a p-type single crystal silicon substrate, the pair of high-concentration impurity diffusion regions 113 may be n-type impurity diffusion regions that are higher in n-type impurity concentration than the low-concentration impurity diffusion regions 112, for example.

The second interlayer insulation film 43 is disposed so as to cover an upper surface of the first interlayer insulation film 28 and an upper surface of the element isolation region 15-2. An upper surface of the second interlayer insulation film 43 is flat. The upper surface of the second interlayer insulation film 43 is flush with upper surfaces of cover insulation films 34-1 and 34-2.

For example, the second interlayer insulation film 43 may be a silicon oxide film ($SiO_2$ film) formed by CVD (Chemical Vapor Deposition) method, or a coating-type insulation film (silicon oxide film ($SiO_2$ film)) formed by SOG (Spin On Glass) method.

The first contact hole 45 is placed in such a way as to pass through the first and second interlayer insulation films 28 and 43 that are located on the first capacitance impurity diffusion region 85. The first contact hole 45 exposes the upper surface of the first capacitance impurity diffusion region 85.

The first contact hole 46 is placed in such a way as to pass through the first and second interlayer insulation films 28 and 43 that are located on the second capacitance impurity diffusion region 93. The first contact hole 46 exposes the upper surface of the second capacitance impurity diffusion region 93.

The second contact hole 48 is placed in such a way as to pass through the second interlayer insulation film 43 located on the high-concentration impurity diffusion region 113. The second contact hole 48 exposes the upper surface of the high-concentration impurity diffusion region 113.

The capacitance contact plug 51 is placed in such a way as to fill the first contact hole 45. Accordingly, a lower end of the capacitance contact plug 51 is in contact with the first capacitance impurity diffusion region 85. An upper-end surface of the capacitance contact plug 51 is flat, and flush with the upper surface of the second interlayer insulation film 43.

The capacitance contact plug 52 is placed in such a way as to fill the first contact hole 46. Accordingly, a lower end of the capacitance contact plug 52 is in contact with the second capacitance impurity diffusion region 93.

An upper-end surface of the capacitance contact plug 52 is flat, and flush with the upper surface of the second interlayer insulation film 43.

The first contact plug 53 is placed in such a way as to fill the second contact hole 48. Accordingly, a lower end of the first contact plug 53 is in contact with the high-concentration impurity diffusion region 113.

An upper-end surface of the first contact plug 53 is flat, and flush with the upper surface of the second interlayer insulation film 43.

The first wiring pattern 55 is provided on the second interlayer insulation film 43 disposed in the peripheral circuit region F. The first wiring pattern 55 includes a wiring section and a pad section 55A, which is formed integrally with the wiring section and is greater in width than the wiring section. The pad section 55A is connected to the upper end of the first contact plug 53.

In this manner, the first wiring pattern 55 is electrically connected to the high-concentration impurity diffusion region 113 via the first contact plug 53.

The stopper film 57 is placed on the upper surface of the second interlayer insulation film 43 disposed in the memory cell region E and peripheral circuit region F, in such a way as to cover the first wiring pattern 55. The stopper film 57 is an insulation film that functions as a stopper film when anisotropic dry etching is performed of the third and fourth interlayer insulation films 59 and 66.

The stopper film 57 may be an insulation film that is unlikely to be etched during the anisotropic dry etching under conditions for etching the third and fourth interlayer insulation films 59 and 66.

More specifically, if a silicon oxide film ($SiO_2$ film) is used as the third and fourth interlayer insulation films 59 and 66, the stopper film 57 may be a silicon nitride film (SiN film), for example.

The third interlayer insulation film 59 is disposed so as to cover an upper surface of the stopper film 57. The thickness of the third interlayer insulation film 59 is set in such a way that the cylinder hole 62 formed in the stopper film 57 and third interlayer insulation film 59 has a desired depth.

For example, the third interlayer insulation film 59 may be a silicon oxide film ($SiO_2$ film) formed by CVD method, or a coating-type insulation film (silicon oxide film ($SiO_2$ film)) formed by SOG method.

The cylinder hole 62 is provided in such a way as to pass through the stopper film 57 and third interlayer insulation film 59 located on an associated one of the capacitance contact plugs 51 and 52. The cylinder hole 62 is a cylindrical space, and exposes the upper-end surface of the associated one of the capacitance contact plug 51 and 52.

The capacitor 64 is disposed so as to fill the cylinder holes 62. The capacitor 64 includes a lower electrode 117, a capacitance insulation film 118, and an upper electrode 119.

The lower electrode 117 is formed into the shape of a crown (crown shape), and is disposed so as to cover an inner wall of the cylinder holes 62. The lower electrode 117 is connected to an upper end of the capacitance contact plug 51 and an upper end of the capacitance contact plug 52.

Accordingly, the lower electrode 117 placed on the capacitance contact plug 51 is electrically connected to the first capacitance impurity diffusion region 85 via the capacitance contact plug 51.

The lower electrode 117 placed on the capacitance contact plug 52 is electrically connected to the second capacitance impurity diffusion region 93 via the capacitance contact plug 52.

The metal film that constitutes the lower electrode 117 may be a titanium nitride film (TiN film), for example.

The capacitance insulation film 118 is disposed so as to cover a surface of the lower electrode 117 and an upper surface of the third interlayer insulation film 59. The thickness of the capacitance insulation film 118 is so set as not to completely fill an internal portion of each of the cylinder holes 62.

For example, the capacitance insulation film 118 may be a hafnium oxide film ($HfO_2$ film), a zirconium oxide film ($ZrO_2$ film), an aluminum oxide film ($Al_2O_3$ film), a strontium titanate film ($SrTiO_3$ film), a laminated film of those films, or the like.

The upper electrode 119 is provided so as to cover a surface of the capacitance insulation film 118. The thickness of the upper electrode 119 is set in such a way that the upper electrode 119 fills the cylinder holes 62 through the lower electrode 117 and the capacitance insulation film 118. An upper surface of the upper electrode 119 is flat.

The metal film that constitutes the upper electrode 119 may be a titanium nitride film (TiN film), for example.

Among the capacitors 64 with the above configuration, the capacitor 64 disposed on the capacitance contact plug 51 is electrically connected to the first transistor 25 via the capacitance contact plug 51.

Among the capacitors 64, the capacitor 64 disposed on the capacitance contact plug 52 is electrically connected to the second transistor 26 via the capacitance contact plug 52.

Figure 3:
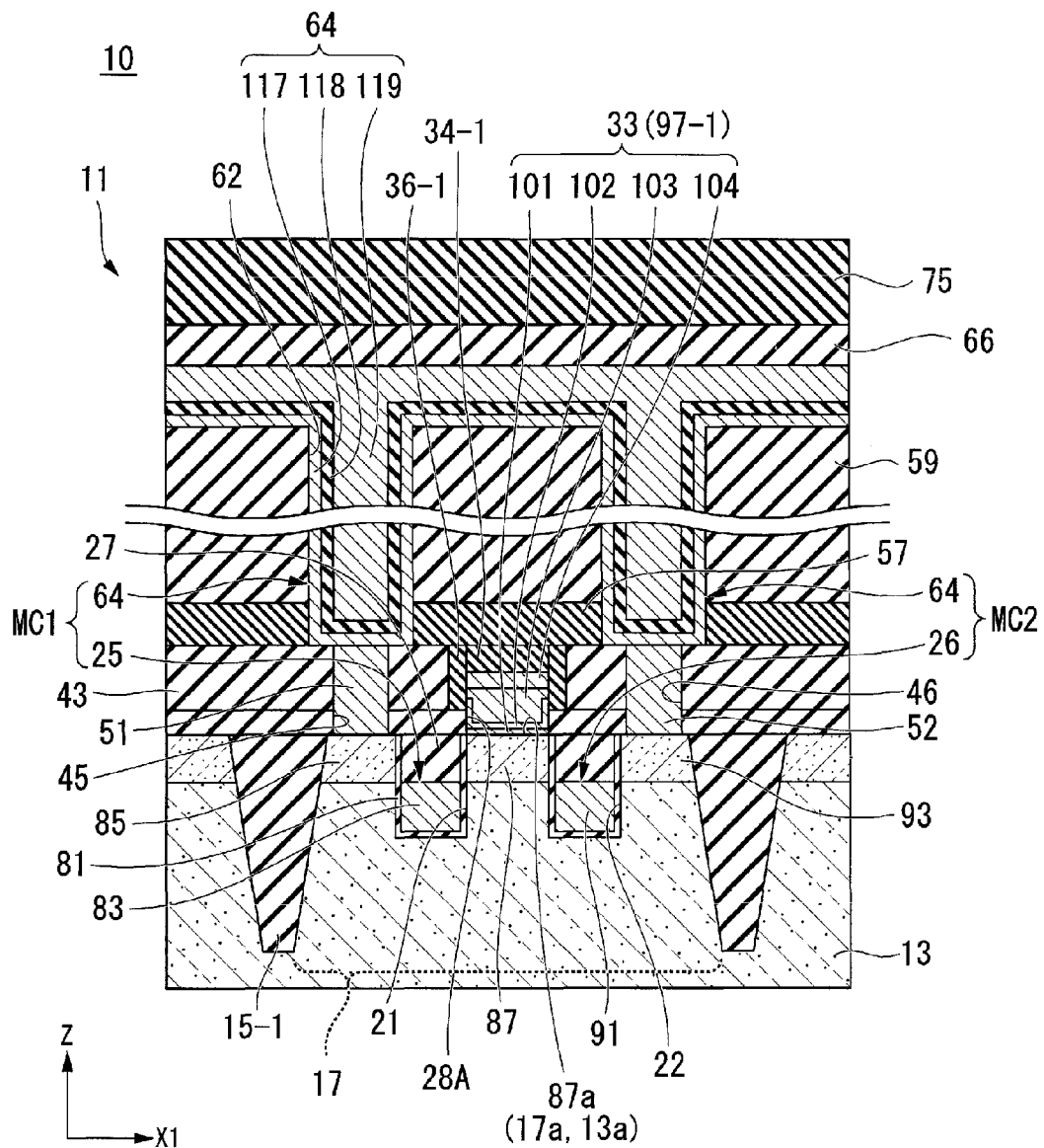
FIG. 3 is across-sectional view of a memory cell section of the semiconductor device taken along a line B-B shown in FIG. 1.
Figure 4:
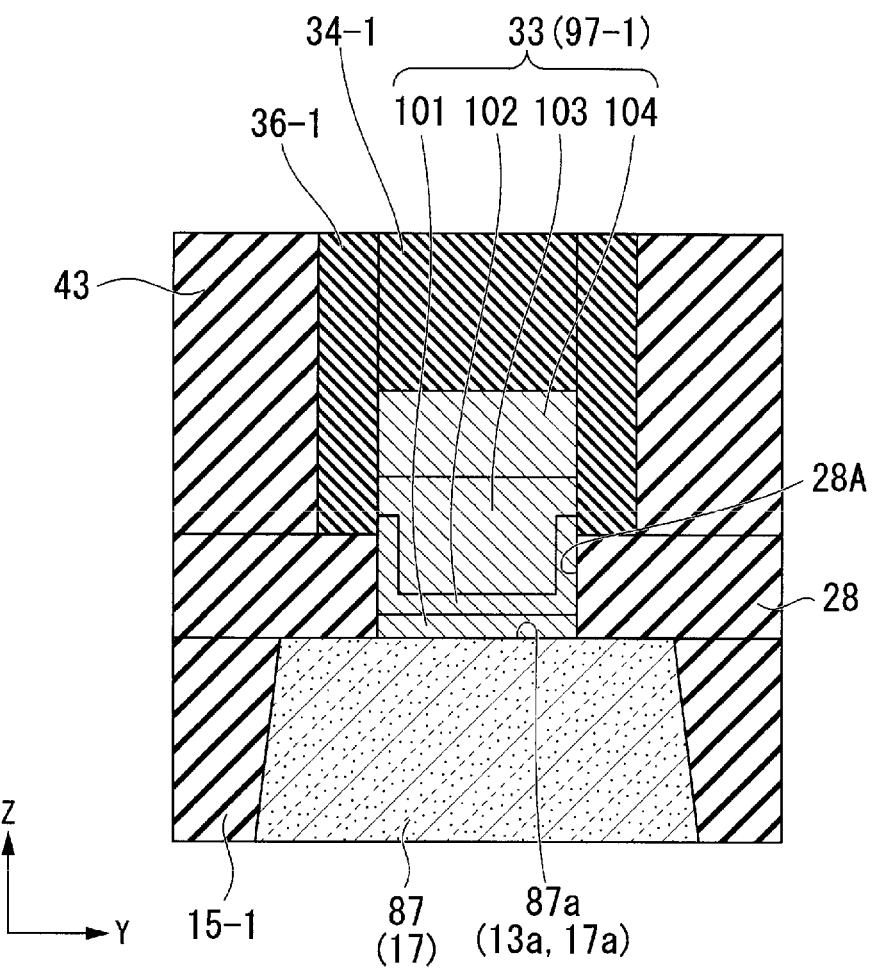
FIG. 4 is an enlarged cross-sectional view of a portion of the memory cell section that is surrounded by a region C shown in FIG. 2.
Figure 5:
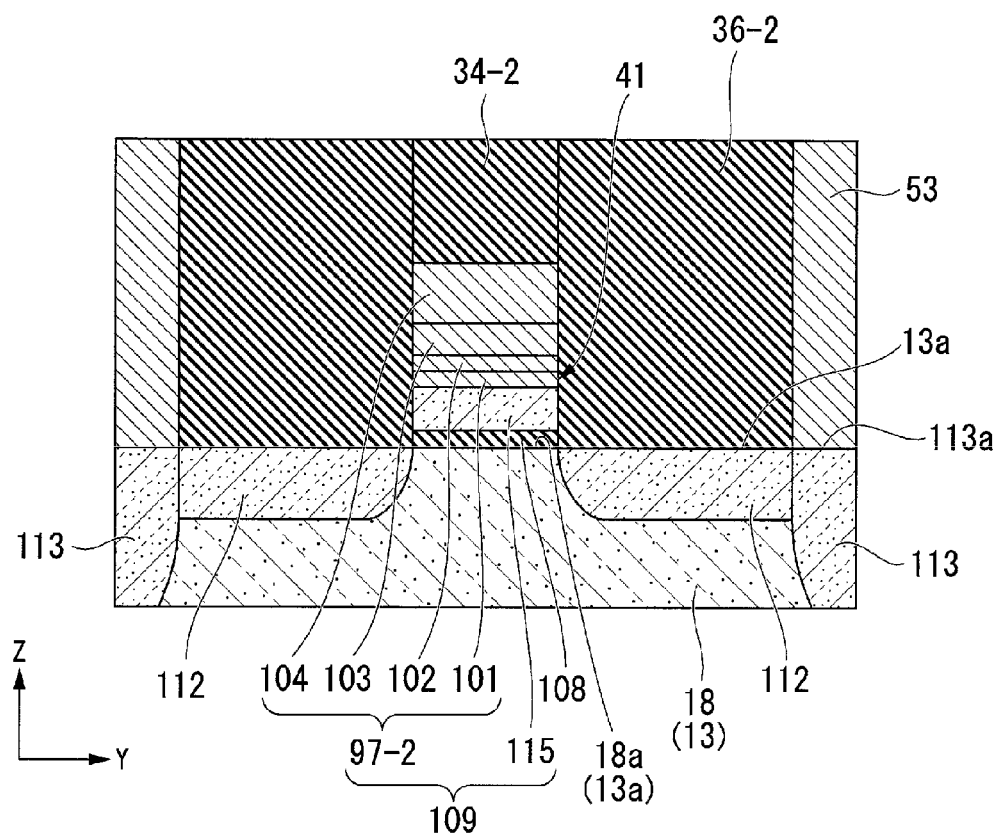
FIG. 5 is an enlarged cross-sectional view of a portion of the memory cell section that is surrounded by a region D shown in FIG. 2.

Incidentally, as one example of the capacitors 64, FIG. 3 shows cylinder-type capacitors that are configured so as to fill the cylinder holes 62. However, the shape of the capacitors 64 is not limited to that. For example, as the capacitors 64, crown-type capacitors may be used.

The first memory cell MC1 includes the first transistor 25; and the capacitor 64 that is placed above the capacitance contact plug 51 and electrically connected to the first transistor 25.

The second memory cell MC2 includes the second transistor 26; and the capacitor 64 that is placed above the capacitance contact plug 52 and electrically connected to the second transistor 26.

The fourth interlayer insulation film 66 is disposed so as to cover an upper surface of the upper electrode 119 and an upper surface of the third interlayer insulation film 59 that is placed in the peripheral circuit region F.

For example, the fourth interlayer insulation film 66 may be a silicon oxide film ($SiO_2$ film) formed by CVD method, or a coating-type insulation film (silicon oxide film ($SiO_2$ film)) formed by SOG method.

The third contact hole 68 is provided so as to pass through the stopper film 57 that is located on the pad section 55A of the first wiring pattern 55, the third interlayer insulation film 59, and the fourth interlayer insulation film 66. In this manner, the third contact hole 68 exposes the upper surface of the pad section 55A of the first wiring pattern 55.

The second contact plug 71 is provided so as to fill the third contact hole 68. A lower end of the second contact plug 71 is connected to the pad section 55A of the first wiring pattern 55.

Therefore, the second contact plug 71 is electrically connected to the high-concentration impurity diffusion region 113 of the peripheral circuit transistor 41 via the first wiring pattern 55.

The second wiring pattern 73 is placed on an upper surface of the fourth interlayer insulation film 66 that is located in the peripheral circuit region F. The second wiring pattern 73 is connected to an upper end of the second contact plug 71.

Accordingly, the second wiring pattern 73 is electrically connected to the peripheral circuit transistor 41 via the second contact plug 71.

The protective insulation film 75 is provided so as to cover the second wiring pattern 73 and an upper surface of the fourth interlayer insulation film 66 that is located in the memory cell region E and peripheral circuit region F. The protective insulation film 75 has a function of protecting the second wiring pattern 73, which is placed on the top layer.

For example, the protective insulation film 75 may be an insulation film made of polyimide resin, for example.

The semiconductor device of the present embodiment includes: the semiconductor substrate 13, which includes the memory cell region E and the peripheral circuit region F disposed around the memory cell region E; the element isolation regions 15-1 and 15-2, which are respectively placed in the memory cell region E and the peripheral circuit region F; the cell active region 17, which is disposed in the memory cell region E and defined by the element isolation regions 15-1; the first interlayer insulation film 28, which is disposed on the cell active region 17; the bit contact hole 28A, which passes through the first interlayer insulation film 28 and exposes the upper surface 87a of the bit line impurity diffusion region 87 (or part of the upper surface 17a of the cell active region 17); and the bit line 33, which is placed on the first interlayer insulation film 28 in such a way as to fill the bit contact hole 28A and which is made of the first metal laminated film 97-1. Therefore, the bit line 33 made of the first metal laminated film 97-1 (i.e., the bit line that does not contain, among its components or films, a silicon film that is higher in resistance than the metal films) can be connected directly to the bit line impurity diffusion region 87.

Therefore, even if the memory cell section 11 is miniaturized (or if the diameter of the opening of the bit contact hole 28A is made smaller), a rise in the resistance of the bit line 33 is curbed.

Moreover, as the bottom-layer metal film that constitutes the first metal laminated film 97-1, a metal silicide film is used. Accordingly, a rise in the contact resistance between the bit line 33 and the bit line impurity diffusion region 87 can be curbed.

With reference to mainly FIGS. 6 to 14, a method of manufacturing the semiconductor device of the present embodiment will be described. Incidentally, as for the method of manufacturing the semiconductor device 10, the subsequent processes following those shown in FIG. 14 will be described with reference to FIGS. 2 and 3.

Figure 6A:
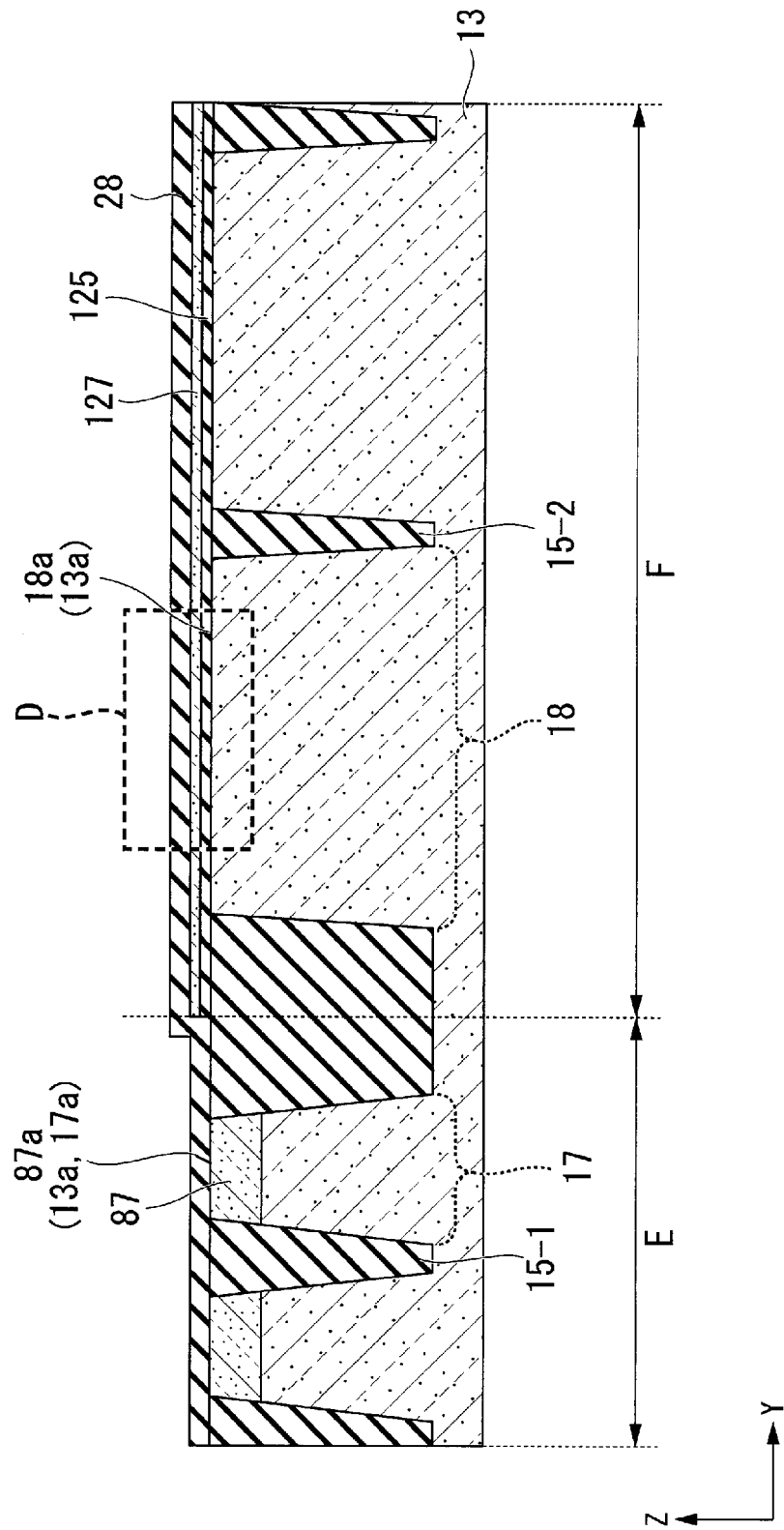
FIG. 6A is a cross-sectional view indicative of one process of a method of manufacturing the semiconductor device according to an embodiment of the present invention, taken along the line A-A shown in FIG. 1.
Figure 6B:
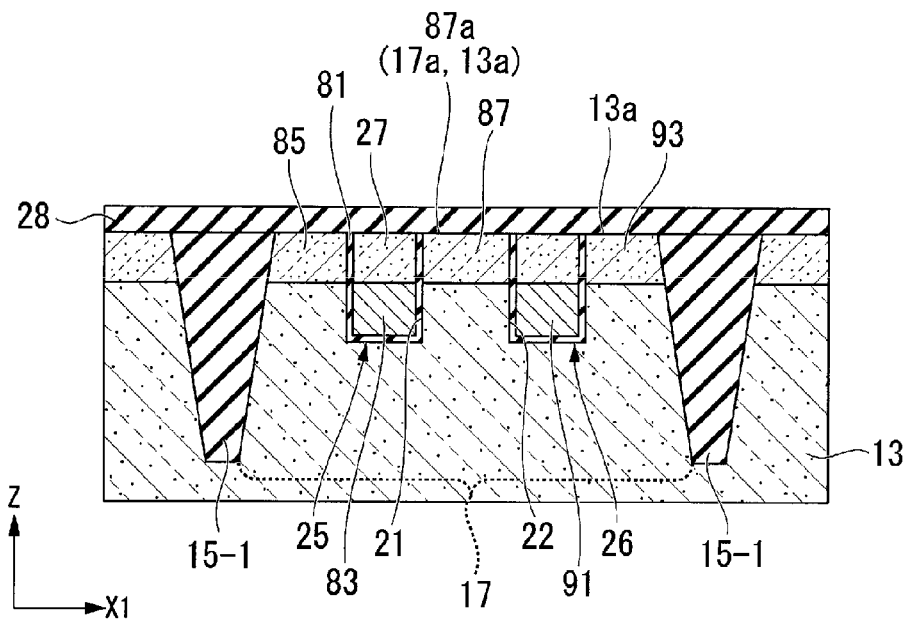
FIG. 6B is a cross-sectional view indicative of the one process of the method of manufacturing the semiconductor device taken along the line B-B shown in FIG. 1.
Figure 6C:
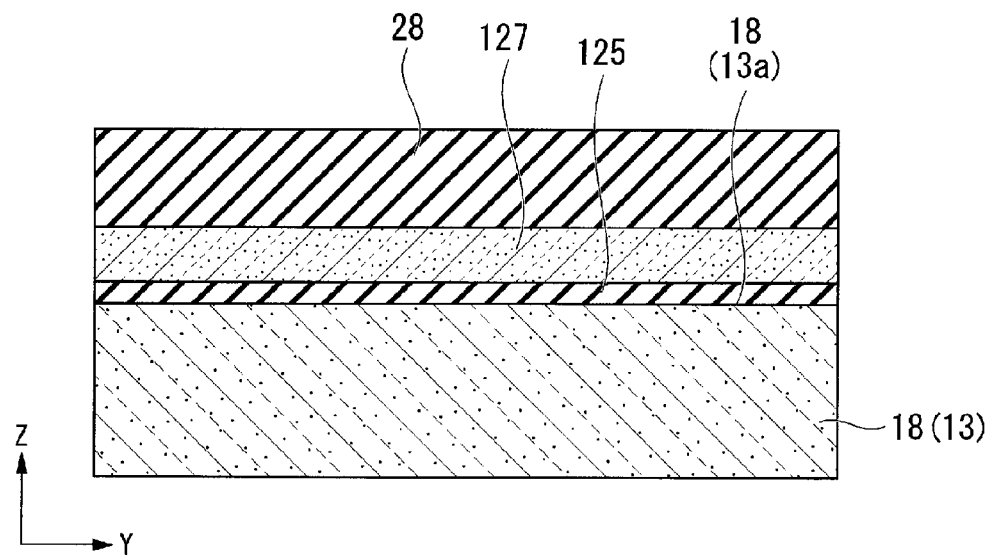
FIG. 6C is an enlarged cross-sectional view of a portion surrounded by a region D shown in FIG. 6A.

First, in the process shown in FIGS. 6A, 6B, and 6C, a p-type single crystal silicon substrate is prepared as the semiconductor substrate 13. Then, the well-known STI (Shallow Trench Isolation) method is used to form, at once, the element isolation regions 15-1 and 15-2 in the main surface 13a's side of the semiconductor substrate 13.

More specifically, for example, in the memory cell region E and the peripheral circuit region F, element isolation trenches (not shown) are formed by photolithographic technique and anisotropic dry etching technique. Then, element isolation insulation film is formed in such a way as to fill the element isolation trenches. In this manner, the element isolation regions 15-1 and 15-2 are formed at once.

In that manner, the following regions are formed at once (see FIG. 1): a plurality of cell active regions 17, which are defined by the element isolation regions 15-1 disposed in the memory cell region E and which extend in the X1-direction and are arranged at predetermined intervals in the X1- and Y-directions; and a plurality of peripheral active regions 18, which are defined by the element isolation regions 15-2 disposed in the peripheral circuit region F and which extend in the Y-direction and are arranged at predetermined intervals in the X- and Y-directions.

The element isolation insulation films (not shown) may be a silicon oxide film ($SiO_2$ film), a silicon nitride film (SiN film), a laminated film of those films, or the like, for example.

The depth of the element isolation regions 15-1 and 15-2 relative to the main surface 13a of the semiconductor substrate 13 is 250 nm, for example.

Then, the photolithographic technique and the anisotropic dry etching technique are used to form, in the cell active region 17 located in the memory cell region E, the first and second grooves 21 and 22 (two grooves), which extend in the Y-direction that crosses the direction (X1-direction) in which the cell active region 17 extends and which divides the upper portion of the cell active region 17 into three.

At this time, the first and second grooves 21 and 22 are formed in such a way as to go over a plurality of cell active regions 17 arranged in the Y-direction and the element isolation regions 15-1.

The depth of the first and second grooves 21 and 22 relative to the main surface 13a of the semiconductor substrate 13 is 150 nm, for example.

Then, a well-known technique is used to form the gate insulation film 81 that covers the inner surfaces of the first and second grooves 21 and 22.

More specifically, for example, a thermal oxidation method is used to oxidize the cell active region 17 exposed at the inner surfaces of the first and second grooves 21 and 22 (i.e., the semiconductor substrate 13 made of the single crystal silicon substrate). As a result, a silicon oxide film ($SiO_2$ film) is formed in such a way as to cover the inner surfaces of the first and second grooves 21 and 22. In this manner, the gate insulation film 81 made of the silicon oxide film ($SiO_2$ film) is formed.

Incidentally, any method other than the thermal oxidation method may be used to form the gate insulation film 81 that covers the inner surfaces of the first and second grooves 21 and 22.

In this case, for example, the gate insulation film 81 may be a single-layer silicon oxide film ($SiO_2$ film), a silicon oxynitride film (SiON film), a laminated silicon oxide film ($SiO_2$ film), a laminated film made by laminating a silicon nitride film (SiN film) on a silicon oxide film ($SiO_2$ film), or the like.

Then, a well-known technique is used to form the following electrodes at once: the embedded gate electrode 83, which is placed in such a way as to fill the lower portion of the first groove 21 through the gate insulation film 81 and which extends in the Y-direction; and the embedded gate electrode 91, which is placed in such a way as to fill the lower portion of the second groove 22 through the gate insulation film 81 and which extends in the Y-direction.

More specifically, for example, the method described below is used to form the embedded gate electrodes 83 and 91. First, a titanium nitride film (TiN film) and a tungsten film (W film), which are base materials of the embedded gate electrodes 83 and 91, are sequentially formed in such a way as to fill the first and second grooves 21 and 22.

After that, etching-back is performed by anisotropic dry etching in such a way that the titanium nitride film (TiN film) and the tungsten film (W film) remain only in the lower portions of the first and second grooves 21 and 22. In this manner, the embedded gate electrodes 83 and 91 are formed.

Then, a well-known technique is used to form the embedded insulation films 27, which fill the upper portions of the first and second grooves 21 and 22, respectively, and whose upper surface is flush with the main surface 13a of the semiconductor substrate 13.

As a result, the upper surfaces of the embedded gate electrodes 83 and 91 are covered with the embedded insulation films 27, respectively. For example, each of the embedded insulation films 27 may be a silicon oxide film ($SiO_2$ film), a silicon nitride film (SiN film), a laminated film of those films, or the like.

Then, the photolithographic technique and the ion implantation technique are used to perform ion implantation of n-type impurities into the upper surface 17a of the cell active region 17. As a result, the following regions are formed at once: the first capacitance impurity diffusion region 85, which is disposed in one end portion 17A (see FIG. 1) of the cell active region 17; the second capacitance impurity diffusion region 93, which is disposed in the other end portion 17B (see FIG. 1) of the cell active region 17; and the bit line impurity diffusion region 87, which is disposed in the cell active region 17 between the first groove 21 and the second groove 22.

At this time, the first capacitance impurity diffusion region 85, the second capacitance impurity diffusion region 93, and the bit line impurity diffusion region 87 are formed in such a way that the upper surfaces of the regions 85, 93, and 87 are flush with the upper surface 17a of the cell active region 17 (or the main surface 13a of the semiconductor substrate 13).

In that manner, the first transistor 25 and the second transistor 26 are formed: the first transistor 25 includes the gate insulated film 81 formed on the inner surface of the first groove 21, the embedded gate electrode 83, the first capacitance impurity diffusion region 85, and the bit line impurity diffusion region 87; and the second transistor 26 includes the gate insulated film 81 formed on the inner surface of the second groove 22, the embedded gate electrode 91, the second capacitance impurity diffusion region 93, and the bit line impurity diffusion region 87.

Then, a well-known technique is used to sequentially form an insulation film 125, which covers the upper surface of the peripheral active region F and the upper surface of the element isolation region 15-2, and a polysilicon film 127, which covers an upper surface of the insulation film 125.

The insulation film 125 is a film that is base material of the peripheral circuit gate insulation film 108, which is one of components of the peripheral circuit transistor 41. The insulation film 125 may be a high dielectric constant film (High-K film), for example.

More specifically, for example, the method described below is used to form the insulation film 125 disposed in the peripheral circuit region F, and the polysilicon film 127.

First, the insulation film 125 (e.g. high dielectric constant film) is formed in such a way as to cover the upper surfaces of the element isolation regions 15-1 and 15-2, the upper surface 17a of the cell active region 17, the upper surface 18a of the peripheral circuit region 18, and the upper surface of the embedded insulation film 27. Then, the polysilicon film 127 is formed to cover the upper surface of the insulation film 125.

Then, the photolithographic technique is used to form a resist mask (not shown) that covers the upper surface of the polysilicon film 127 formed in the peripheral circuit region F. As a result, the upper surface of the polysilicon film 127 formed in the memory cell region E is exposed from the resist mask (not shown).

Then, the resist mask (not shown) is used as an etching mask, and anisotropic dry etching is performed to remove the insulation film 125 and polysilicon film 127 formed in the memory cell region E. As a result, the upper surface 17a of the cell active region 17 and the upper surface of the element isolation region 15-1 are exposed.

Accordingly, only in the peripheral circuit region F, the laminated insulation film 125 and polysilicon film 127 remain.

As the high dielectric constant film that becomes the insulation film 125, for example, an insulation film that has a dielectric constant of 3.9 or more and which is higher than the relative permittivity of a thermally-oxidized film may be formed. For example, the high dielectric constant film may be an insulation film containing hafnium oxide, tantalum oxide, lanthanum oxide, or the like.

In the process shown in FIGS. 11A to 11D described later, patterning of the insulation film 125 is performed, and the peripheral circuit gate insulation film 108 is formed as a result.

That is, the insulation film 125 is an insulation film that is base material of the peripheral circuit gate insulation film 108. The thickness of the insulation film 125 may be 3 nm, for example.

In the process shown in FIGS. 11A to 11D described later, patterning of the polysilicon film 127 is performed. As a result, the polysilicon film 127 becomes part of the gate electrode 109 of the peripheral circuit transistor 41. That is, the polysilicon film 127 is a conductive film that is base material of the gate electrode 109. The thickness of the polysilicon film 127 may be 15 nm, for example.

Then, a well-known technique is used to form the first interlayer insulation film 28 that covers the element isolation regions 15-1, the upper surface of the embedded insulation film 27, the upper surface of the first capacitance impurity diffusion region 85, the upper surface 87a of the bit line impurity diffusion region 87, the upper surface of the second capacitance impurity diffusion region 93, and the upper surface of the polysilicon film 127 formed in the peripheral circuit region F.

As a result, in the peripheral circuit region F, the first interlayer insulation film 28 that is equal in thickness to the first interlayer insulation film 28 formed in the memory cell region E is formed. The thickness of the first interlayer insulation film 28 may be 20 nm, for example.

More specifically, for example, as the first interlayer insulation film 28, a coating-type insulation film (silicon oxide film ($SiO_2$ film)) is formed by SOG method.

Incidentally, instead of the coating-type insulation film, for example, a silicon oxide film ($SiO_2$ film) may be formed by CVD method as the first interlayer insulation film 28.

Then, in the process shown in FIGS. 7A, 7B, 7C, and 7D, the photolithographic technique is used to form an etching mask 131 having openings 131A, on the upper surface of the first interlayer insulation film 28 disposed in the memory cell region E. Therefore, the upper surface of the polysilicon film 127 formed in the peripheral circuit region F is exposed from the etching mask 131.

The openings 131A are formed so as to expose a surface located above the bit line impurity diffusion region 87 which is part of the upper surface of the first interlayer insulation film 28.

Then, anisotropic dry etching is performed by using the etching mask 131, thereby removing the first interlayer insulation film 28 located below the openings 131A. As a result, the bit contact hole 28A is formed so as to pass through the first interlayer insulation film 28 and expose the upper surface 87a of the bit line impurity diffusion region 87. The diameter of the bit contact hole 28A may be 30 nm, for example.

The thickness of the first interlayer insulation film 28 that is exposed from the etching mask 131 and formed in the peripheral circuit region F is equal to the thickness of the first interlayer insulation film 28 disposed below the openings 131A.

Therefore, when the first interlayer insulation film 28 located below the openings 131A is removed, the first interlayer insulation film 28 (see FIG. 6A) formed in the peripheral circuit region F is also removed, and the upper surface of the polysilicon film 127 disposed in the peripheral circuit region F is exposed.

That is, the etching mask 131 is formed in such a way that the first interlayer insulation film 28 (see FIG. 6A) formed in the peripheral circuit region F is to be exposed, and etching of the first interlayer insulation film 28 is performed through the etching mask 131. Therefore, there is no need to separately perform a step of removing the first interlayer insulation film 28 formed in the peripheral circuit region F. In this manner, the process of manufacturing the semiconductor device 10 is simplified.

When the bit contact holes 28A are formed by anisotropic dry etching, an end point system may be employed so as to able to detect when the polysilicon film 127 formed in the peripheral circuit region F becomes exposed. Moreover, over-etching of the first interlayer insulation film 28 may be performed in accordance with the influence of micro-loading effects of the bit contact holes 28A with a small opening diameter.

Incidentally, the "micro-loading effects" mean a phenomenon of a decreased etching rate in a region whose aspect ratio is large compared with a region whose aspect ratio (or ratio of depth and width) of mask-pattern openings is small.

In planar view, the area of the polysilicon film 127 disposed above the peripheral circuit region F is quite large. Therefore, when the bit contact holes 28A are to be formed by anisotropic dry etching, the time when the polysilicon film 127 becomes exposed is detected as an end point of etching following the disappearance of the first interlayer insulation film 28 disposed in the peripheral circuit region F. Thus, the accuracy of the etching of the bit contact holes 28A can be improved.

Furthermore, the time when the polysilicon film 127 becomes exposed is recognized as an end point of etching, and a predetermined amount of over-etching is set from that end point. Therefore, it is possible to ensure that a portion of the upper surface of the cell active region 17 is exposed from the bottom of the bit contact hole 28A formed on within the surface of the semiconductor substrate 13. Thus, the accuracy of processing of the bit contact holes 28A can be improved.

As a result, a contact failure is less likely to occur between the bit line 33, which fills the bit contact hole 28A, and the bit line impurity diffusion region 87. Therefore, the yield of the semiconductor devices 10 can be improved.

Furthermore, if the bit contact holes 28A are formed by anisotropic dry etching, the conditions that make it easy to etch the first interlayer insulation film 28 and make it difficult to etch the semiconductor substrate 13 (i.e., the bit line impurity diffusion region 87) may be used.

Under such etching conditions, the bit contact holes 28A are formed by anisotropic dry etching. Accordingly, within the plane of the semiconductor substrate 13, it is possible to keep the bit line impurity diffusion region 87 from being etched.

Figure 7A:
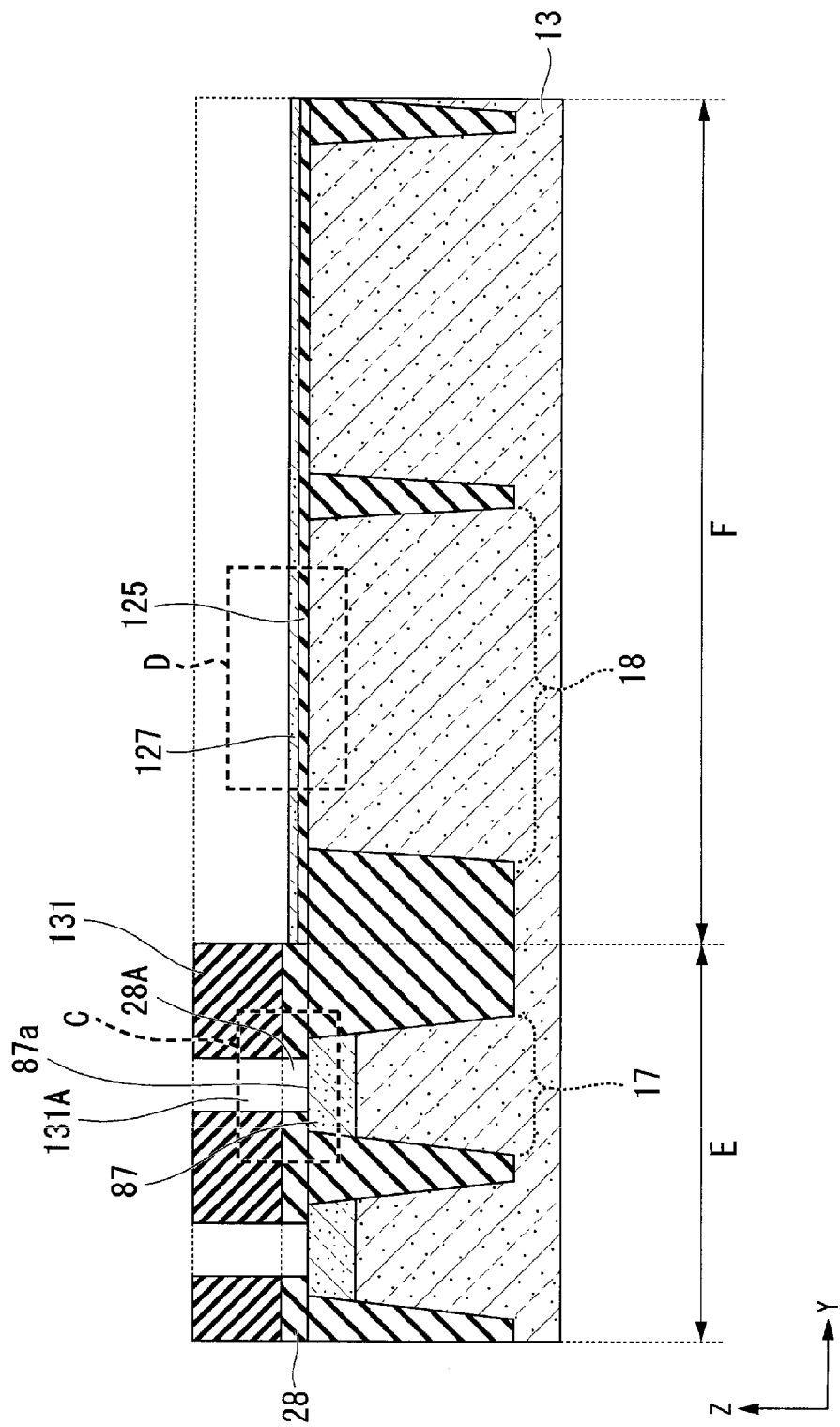
FIG. 7A is a cross-sectional view indicative of one process of the method of manufacturing the semiconductor device taken along the line A-A shown in FIG. 1.
Figure 7B:
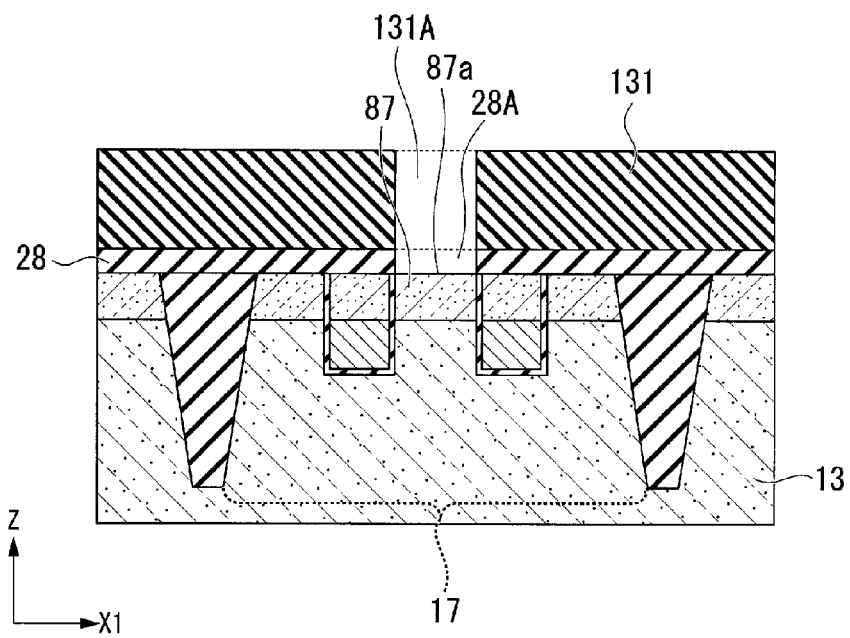
FIG. 7B is a cross-sectional view indicative of the one process of the method of manufacturing the semiconductor device taken along the line B-B shown in FIG. 1.
Figure 7C:
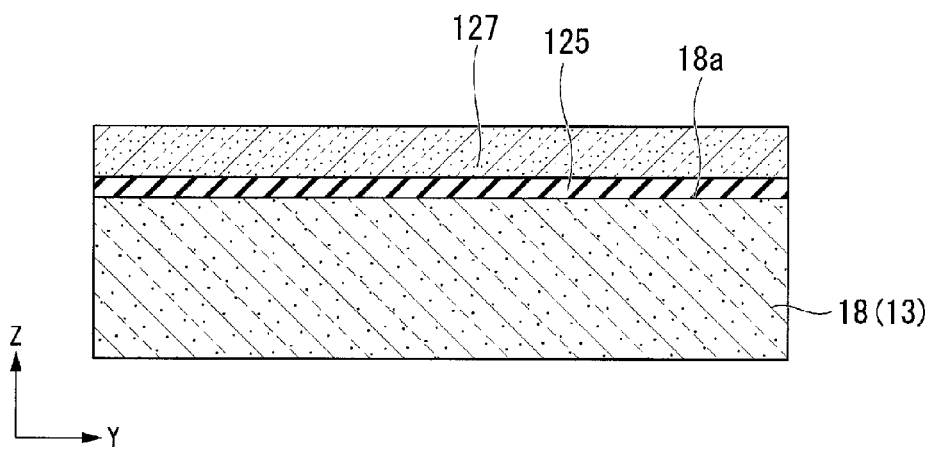
FIG. 7C is an enlarged cross-sectional view of a portion surrounded by a region D shown in FIG. 7A.
Figure 7D:
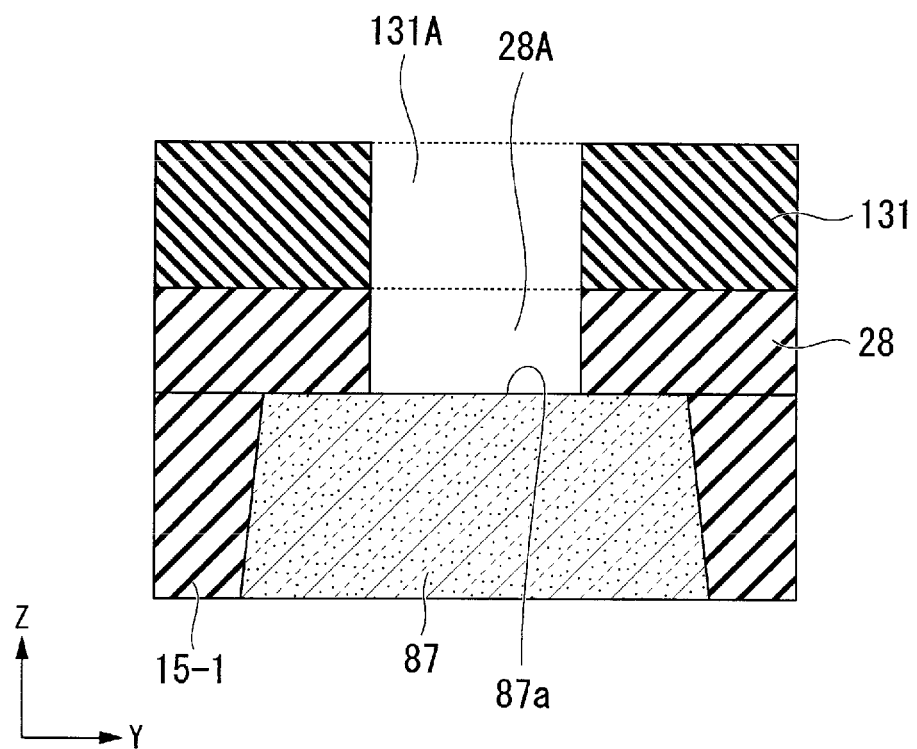
FIG. 7D is an enlarged cross-sectional view of a portion surrounded by a region C shown in FIG. 7A.
Figure 8A:
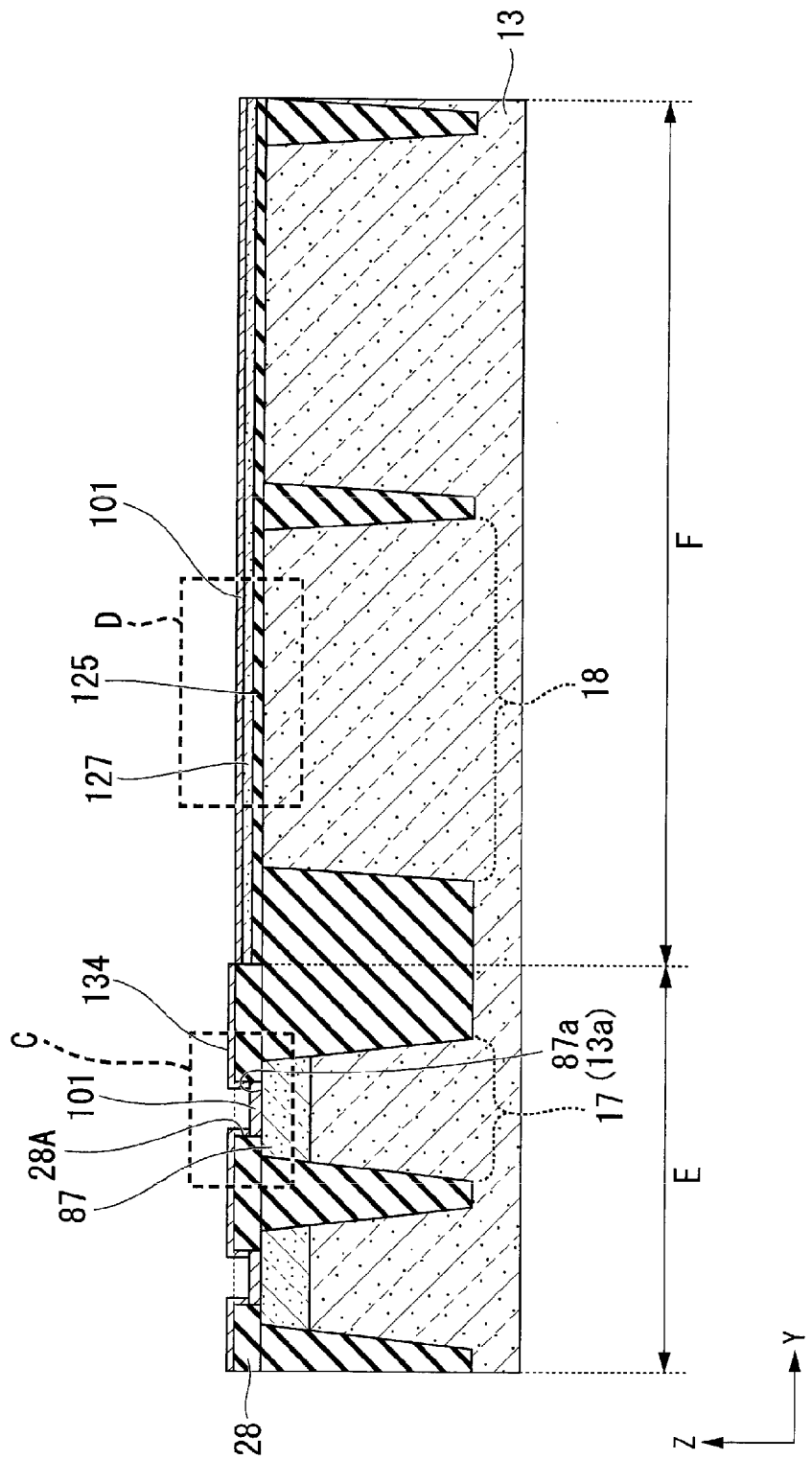
FIG. 8A is a cross-sectional view indicative of one process of the method of manufacturing the semiconductor device taken along the line A-A shown in FIG. 1.
Figure 8B:
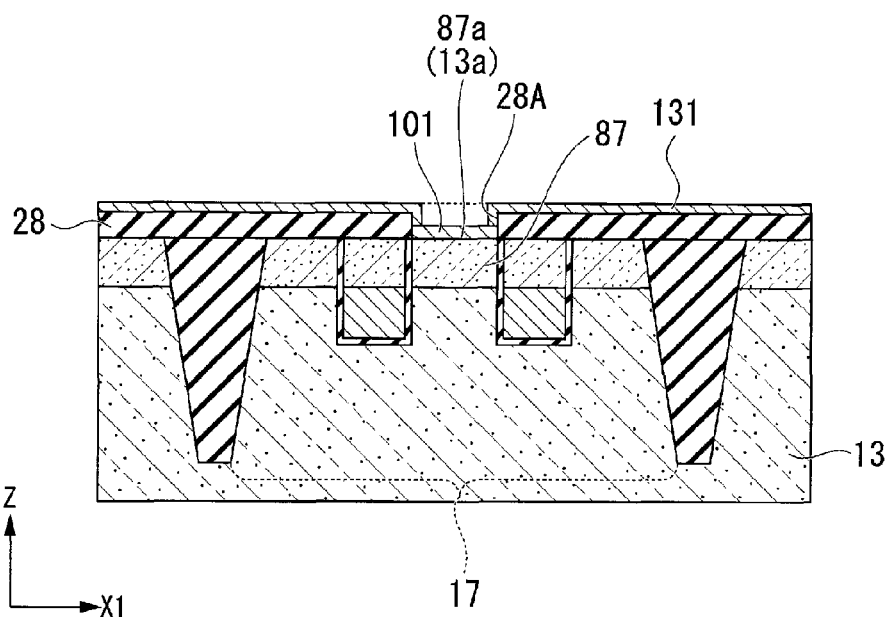
FIG. 8B is a cross-sectional view indicative of the one process of the method of manufacturing the semiconductor device taken along the line B-B shown in FIG. 1.
Figure 8C:
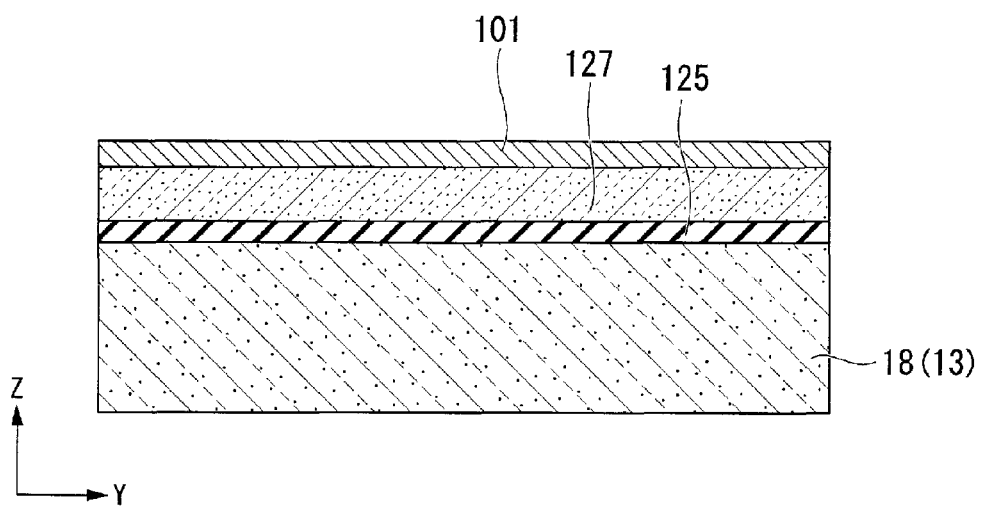
FIG. 8C is an enlarged cross-sectional view of a portion surrounded by a region D shown in FIG. 8A.
Figure 8D:
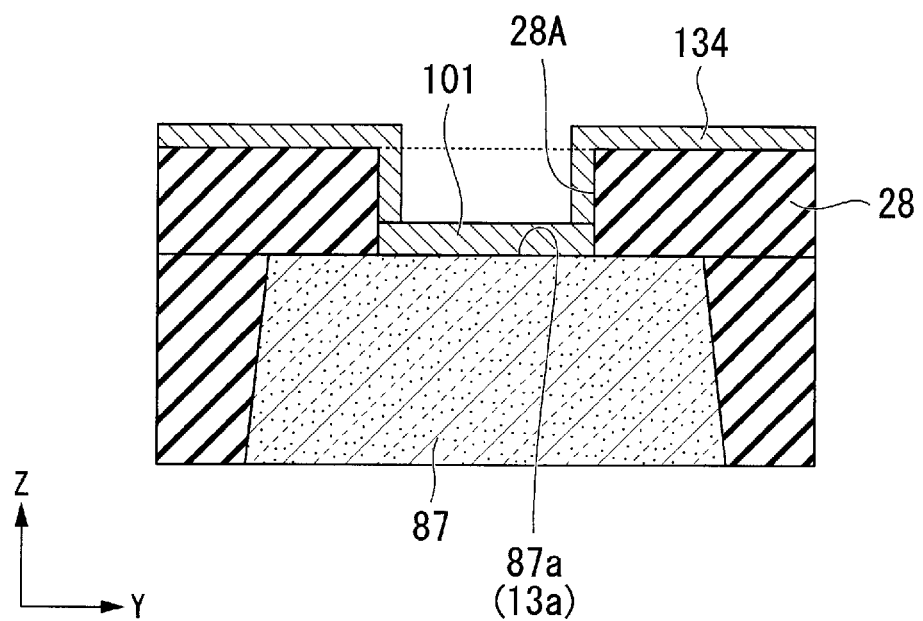
FIG. 8D is an enlarged cross-sectional view of a portion surrounded by a region C shown in FIG. 8A.
Figure 9A:
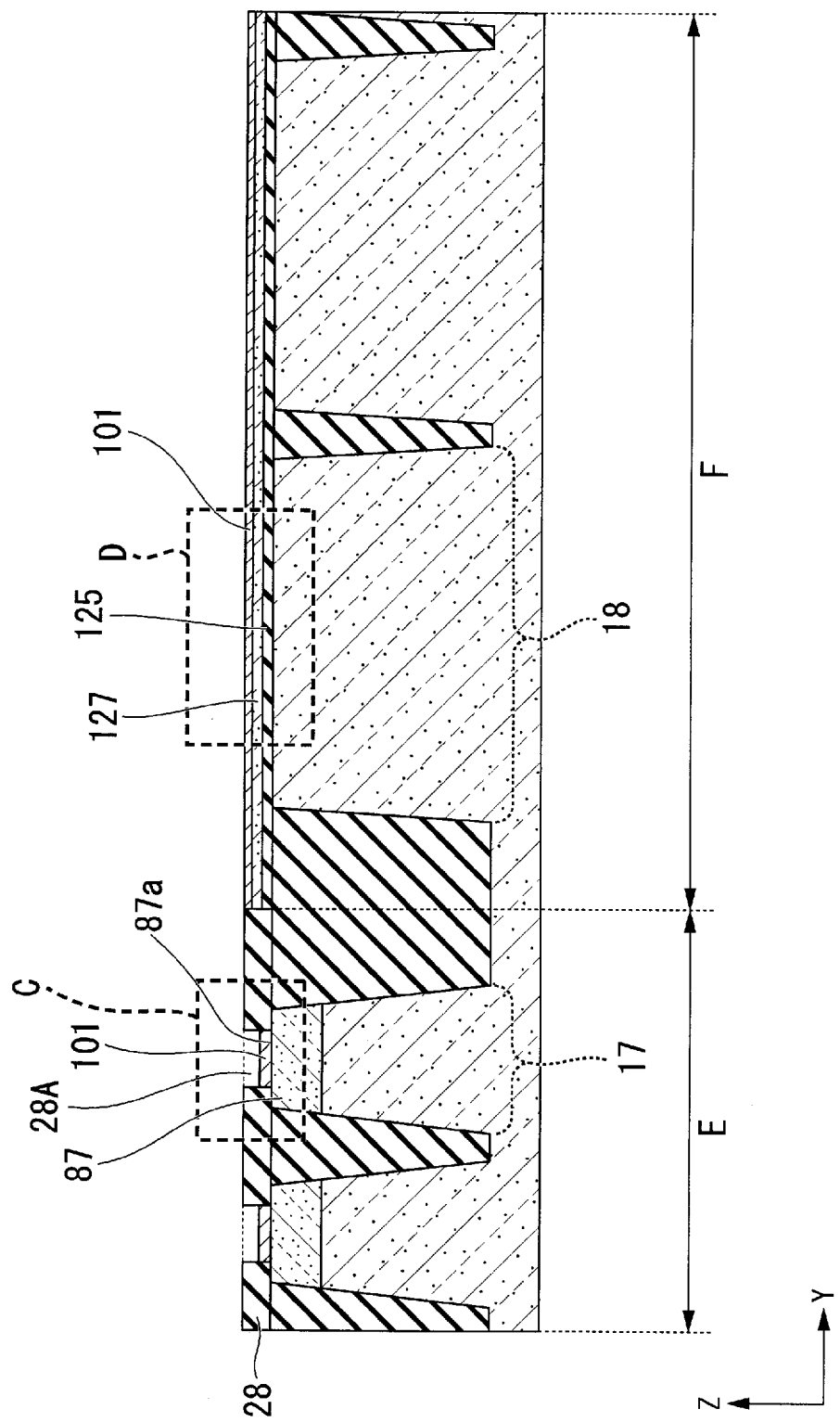
FIG. 9A is a cross-sectional view indicative of one process of the method of manufacturing the semiconductor device taken along the line A-A shown in FIG. 1.
Figure 9B:
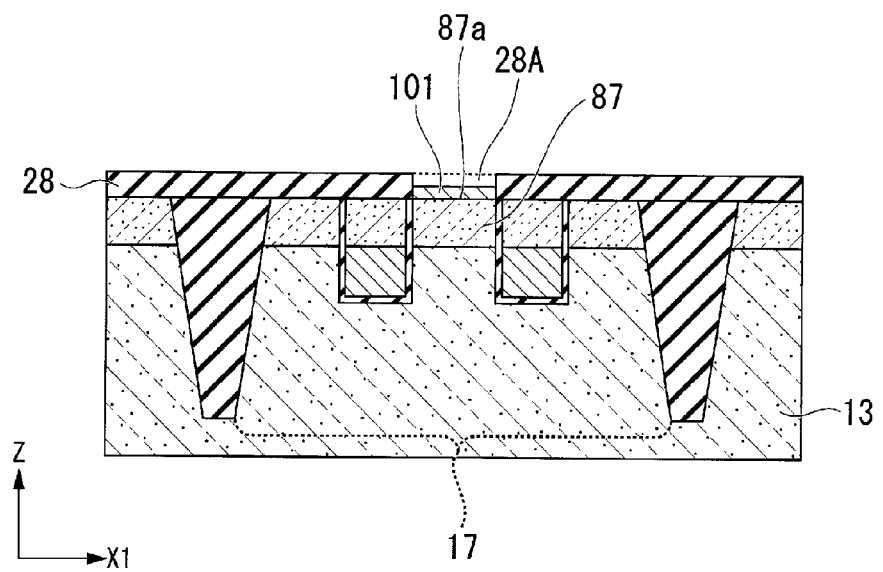
FIG. 9B is a cross-sectional view indicative of the one process of the method of manufacturing the semiconductor device taken along the line B-B shown in FIG. 1.
Figure 9C:
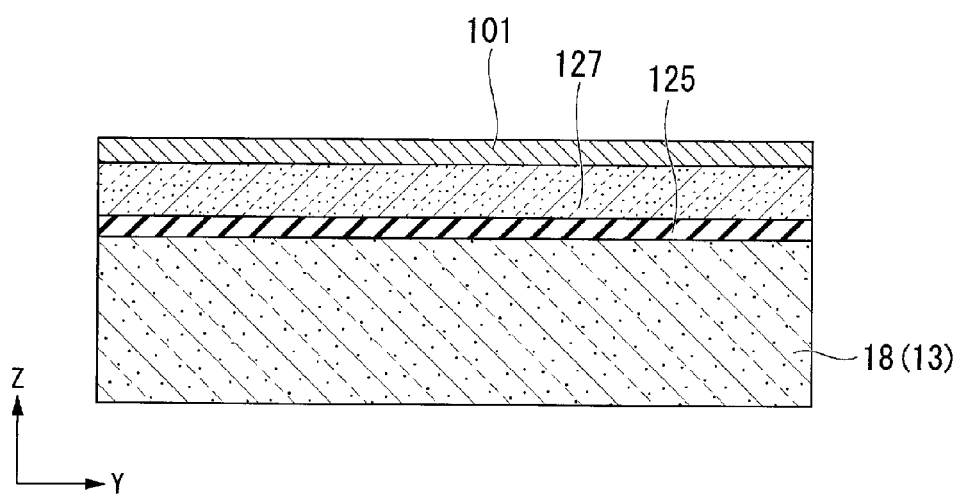
FIG. 9C is an enlarged cross-sectional view of a portion surrounded by a region D shown in FIG. 9A.
Figure 9D:
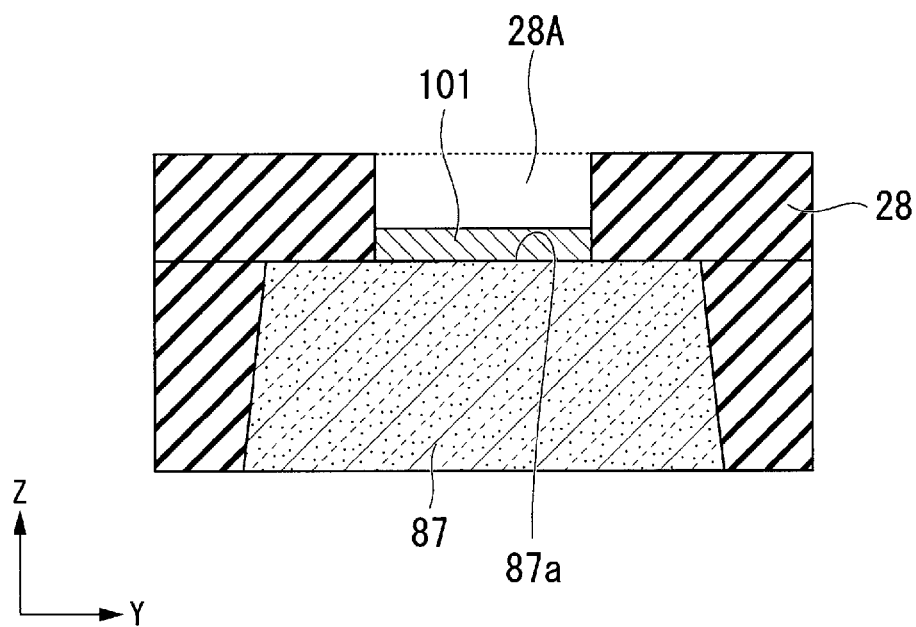
FIG. 9D is an enlarged cross-sectional view of a portion surrounded by a region C shown in FIG. 9A.

Then, in the process shown in FIGS. 8A, 8B, 8C, and 8D, a well-known technique is used to remove the etching mask 131 shown in FIGS. 7A, 7B, and 7D. As a result, the upper surface of the first interlayer insulation film 28 remaining in the memory cell region E is exposed.

Then, a well-known technique is used to form the metal silicide film 101 on the upper surface 87a of the bit line impurity diffusion region 87, which is exposed through the bit contact hole 28A, and the upper surface of the polysilicon film 127. The metal silicide film 101 may be a titanium silicide film (TiSi film), for example.

A method of forming the metal silicide film 101 will be described below with the use of an example in which the titanium silicide film is formed as the metal silicide film 101.

First, a well-known technique is used to form a titanium film 134 that covers the inner surface of the bit contact hole 28A, the upper surface of the first interlayer insulation film 28, and the upper surface of the polysilicon film 127. The thickness of the titanium film 134 may be 2 nm, for example.

Then, heat treatment is performed in such a way that the upper surface 87a of the bit line impurity diffusion region 87 (or the main surface 13a of the semiconductor substrate 13) and the polysilicon film 127 react with the titanium film 134. As a result, the titanium silicide film (TiSi film) is formed as the metal silicide film 101.

In that manner, the metal silicide film 101, which is the titanium silicide film, is formed on the upper surface 87a of the bit line impurity diffusion region 87, which is exposed through the bit contact hole 28A, and the upper surface of the polysilicon film 127.

Figure 11A:
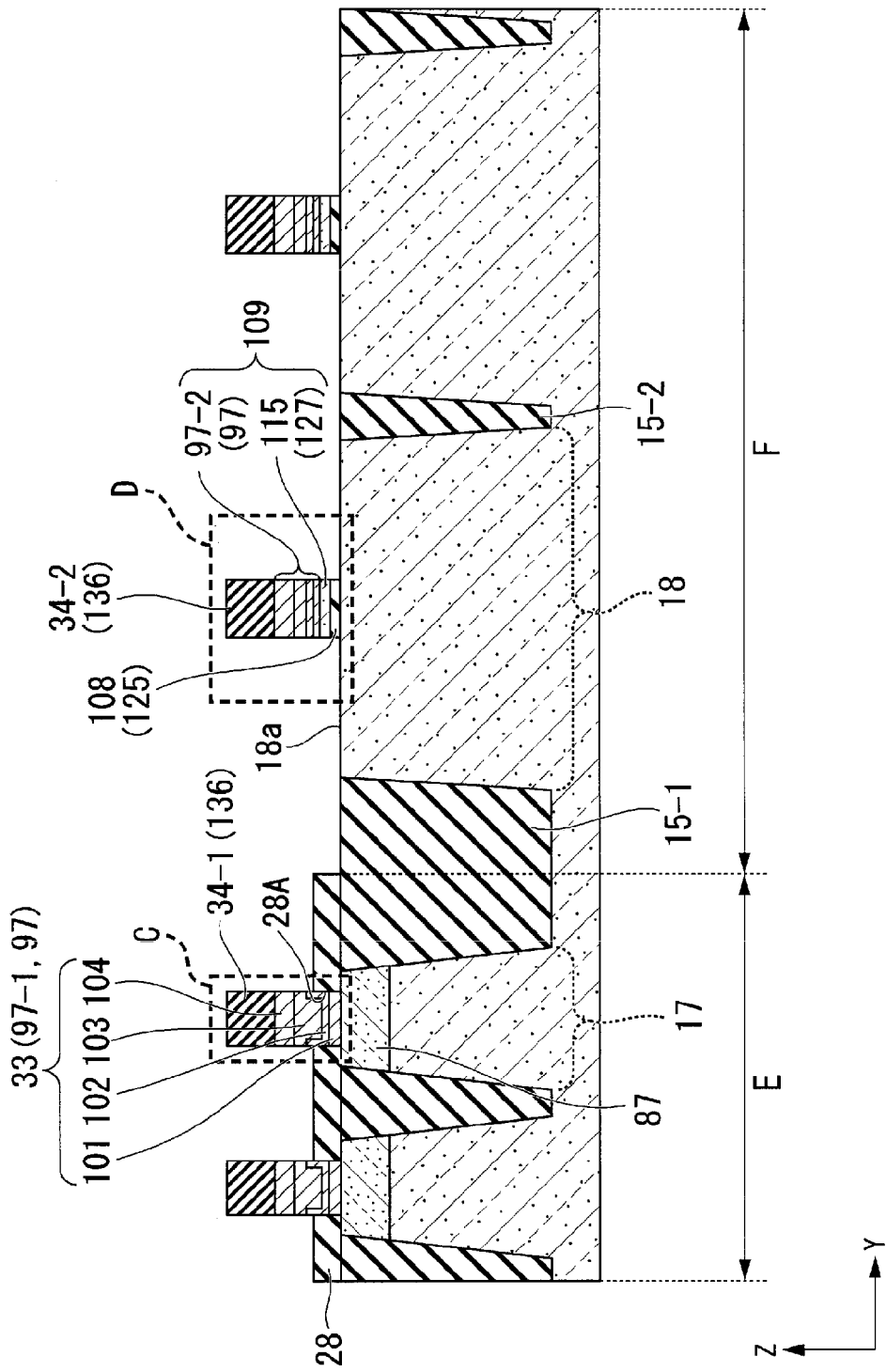
FIG. 11C is an enlarged cross-sectional view of a portion surrounded by a region D shown in FIG. 11A.
FIG. 11D is an enlarged cross-sectional view of a portion surrounded by a region C shown in FIG. 11A.
Figure 11B:
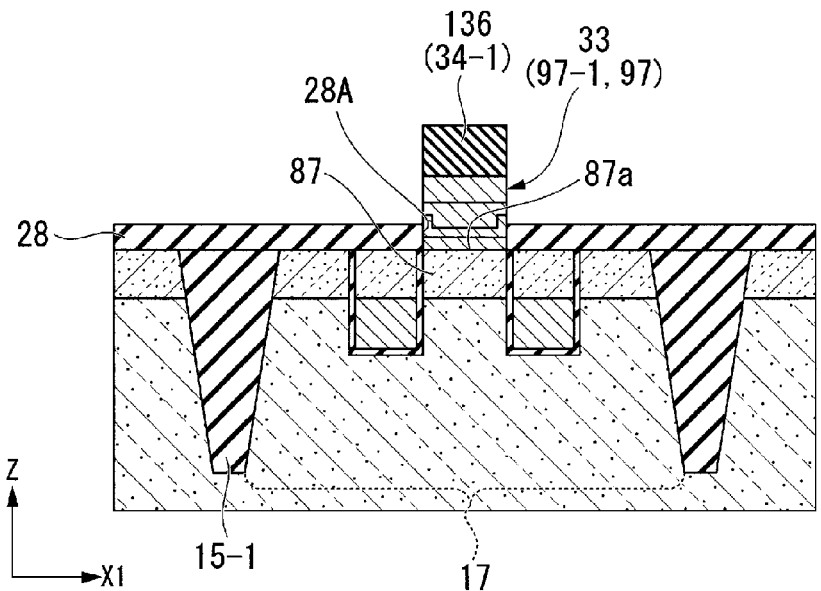
Figure 11C:
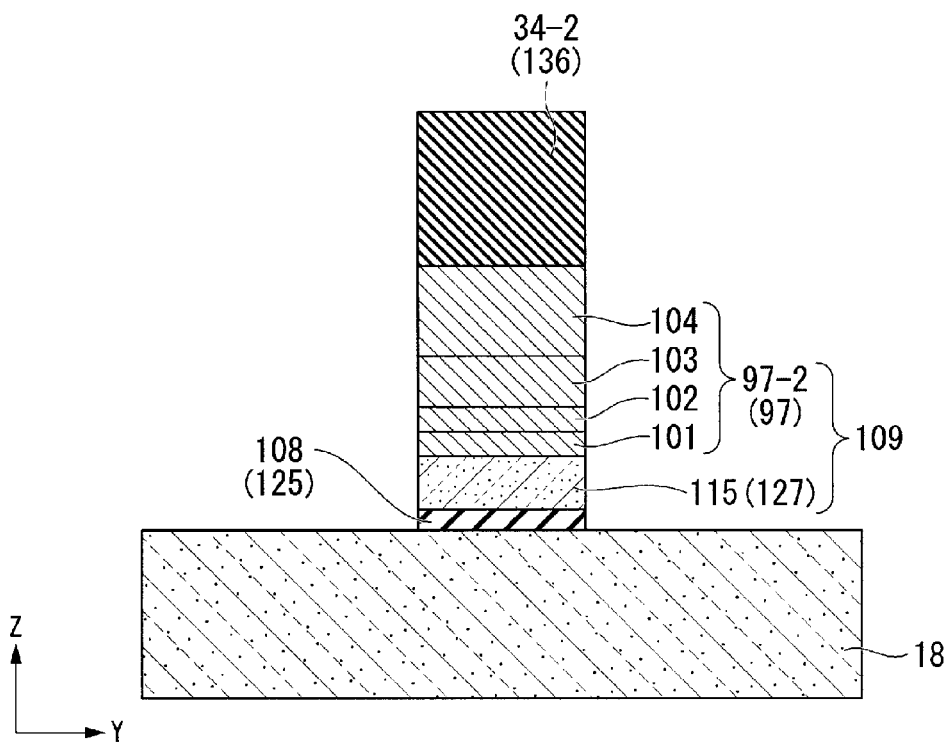
Figure 11D:
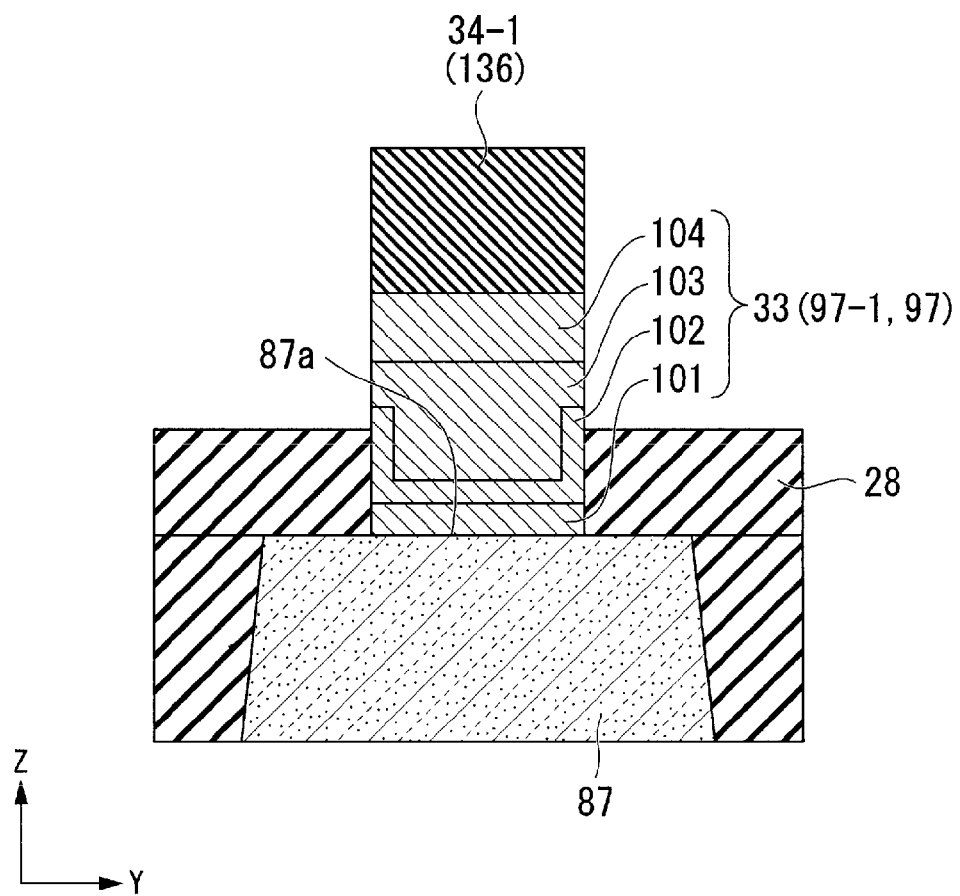

The titanium silicide film 101 that is formed on the upper surface 87a of the bit line impurity diffusion region 87, which is exposed through the bit contact hole 28A, is one of the components of the bit line 33 shown in FIG. 11A. A portion of the titanium silicide film 101 that is formed on the upper surface of the polysilicon film 127 is part of the gate electrode 109 shown in FIG. 11C.

Incidentally, the titanium film 134 that is disposed so as to be in contact with the first interlayer insulation film 28 does not react with silicon during the heat treatment. Therefore, the titanium film 134 does not become a titanium silicide film, and remains unchanged.

Then, in the process shown in FIGS. 9A, 9B, 9C, and 9D, a well-known technique is used to remove the titanium film 134 (see FIG. 8A) remaining on the first interlayer insulation film 28. As a result, the upper surface of the first interlayer insulation film 28 disposed in the memory cell region E is exposed.

At this stage, the thickness of the insulation film 125, the thickness of the polysilicon film 127, the thickness of the first interlayer insulation film 28, and the thickness of the metal silicide film 101 may be adjusted in advance in such a way that the upper surface of the metal silicide film 101 formed on the polysilicon film 127 will be flush with the upper surface of the first interlayer insulation film 28 formed in the memory cell region E containing the cell active region 17.

Accordingly, the upper surface of the metal silicide film 101 formed on the polysilicon film 127 is flush with the upper surface of the first interlayer insulation film 28 formed in the memory cell region E containing the cell active region 17. Therefore, it is possible to avoid generating a difference in height between the bit line 33 formed in the memory cell region E and the gate electrode 109 formed in the peripheral circuit region F.

Then, in the process shown in FIGS. 10A, 10B, 10C, and 10D, a well-known technique is used to form the titanium nitride film 102 that covers the inner surface of the bit contact hole 28A in which the metal silicide film 101 is formed, the upper surface of the first interlayer insulation film. 28, and the upper surface of the polysilicon film 127.

At this time, the thickness of the titanium nitride film 102 is set in such a way as not to fully fill the bit contact hole 28A in which the metal silicide film 101 is formed. For example, the thickness of the titanium nitride film 102 may be 5 nm.

Then, a well-known technique is used to form, on the surface of the titanium nitride film 102, the tungsten silicide film 103 that is thick enough to fill the bit contact hole 28A through the titanium nitride film 102. At this time, the tungsten silicide film 103 is formed in such a way that the upper surface thereof is flat. For example, the thickness of the tungsten silicide film 103 is 10 nm.

Then, a well-known technique is used to form, on the surface of the tungsten silicide film 103, the tungsten film 104 (10 nm in thickness, for example).

As a result, in the memory cell region E and the peripheral circuit region F, the metal laminated film 97 is formed: In the metal laminated film 97, the metal silicide film 101, the titanium nitride film 102, the tungsten silicide film 103, and the tungsten film 104 are sequentially laminated.

Figure 10A:
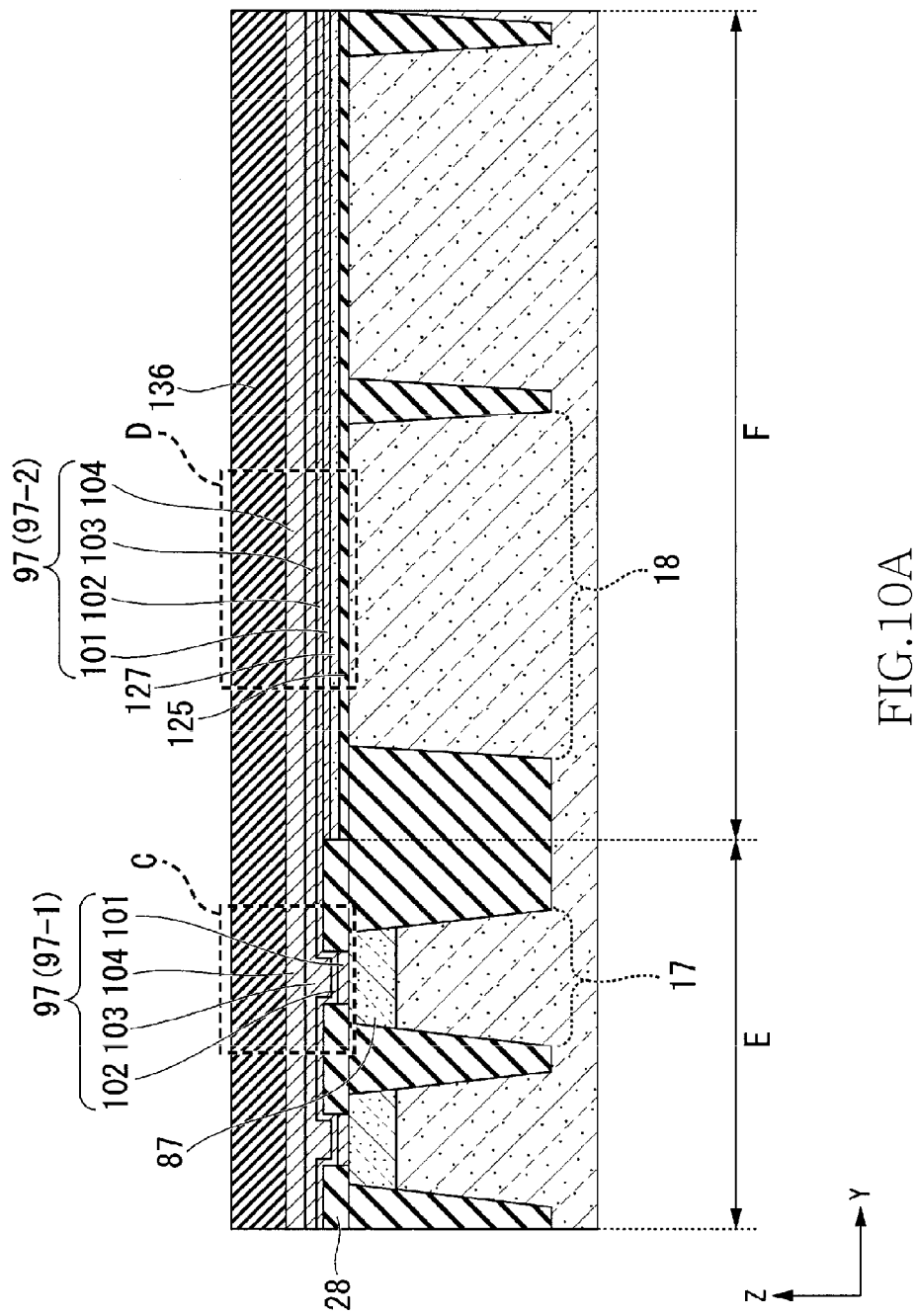
FIG. 10A is a cross-sectional view indicative of one process of the method of manufacturing the semiconductor device taken along the line A-A shown in FIG. 1.
Figure 10B:
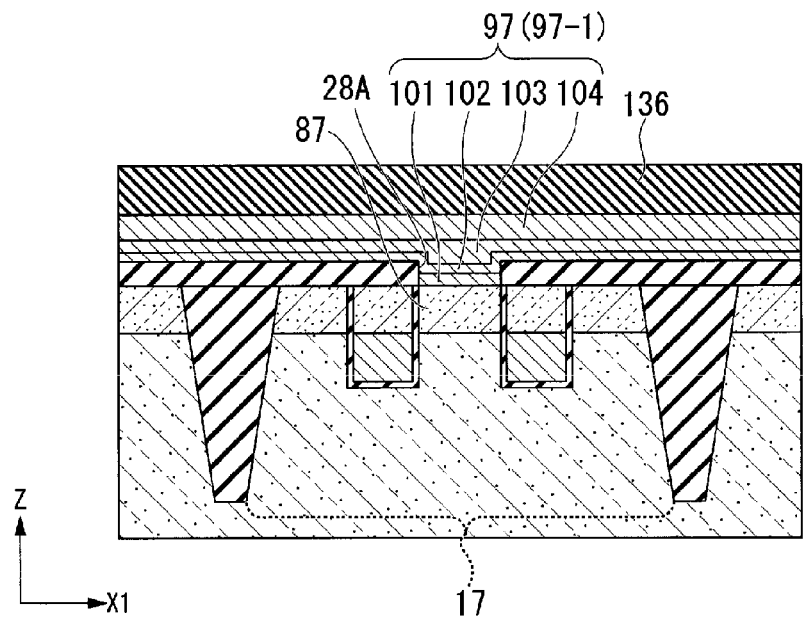
FIG. 10B is a cross-sectional view indicative of the one process of the method of manufacturing the semiconductor device taken along the line B-B shown in FIG. 1.
Figure 10C:
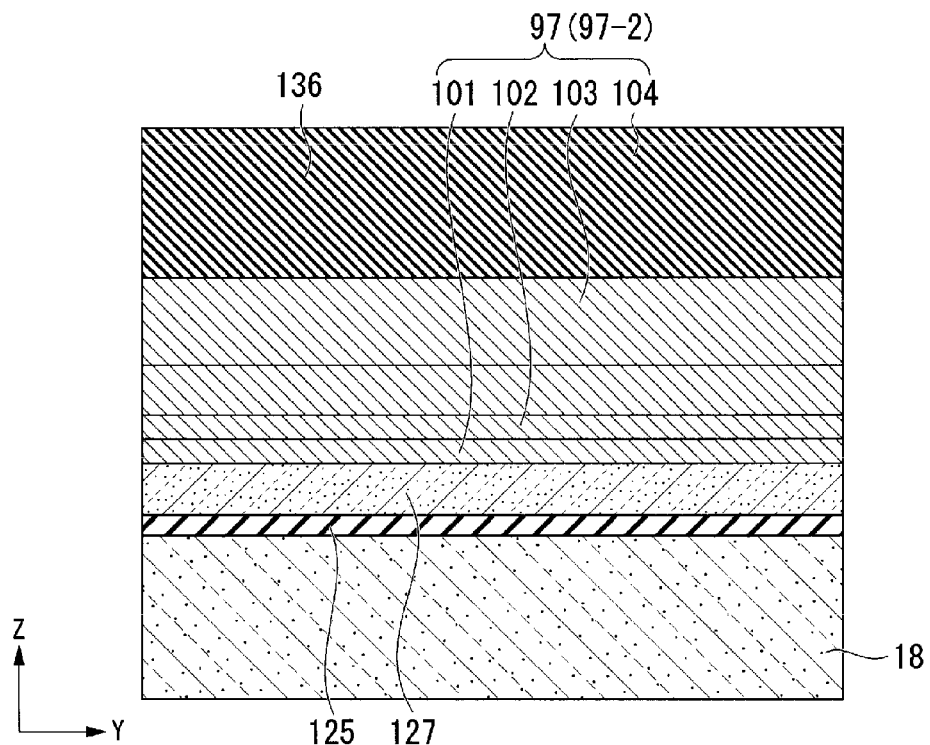
FIG. 10C is an enlarged cross-sectional view of a portion surrounded by a region D shown in FIG. 10A.
Figure 10D:
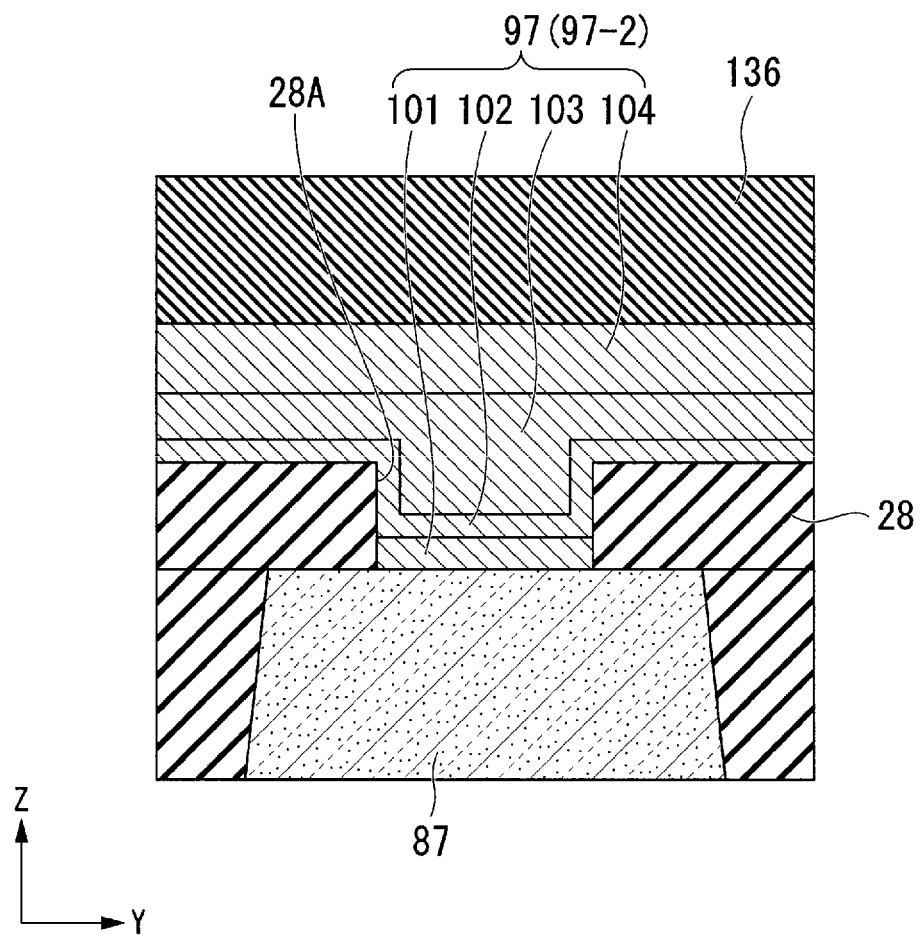
FIG. 10D is an enlarged cross-sectional view of a portion surrounded by a region C shown in FIG. 10A.

Incidentally, a portion of the metal laminated film 97 shown in FIG. 10A that is formed on the bit line impurity diffusion region 87 works as the first metal laminated film 97-1, which makes up the bit line 33 shown in FIG. 3. A portion of the metal laminated film 97 that is formed at the center of the peripheral active region 18 works as the second metal laminated film 97-2 shown in FIG. 5.

Then, a well-known technique is used to form a silicon nitride film 136 that covers the upper surface of the metal laminated film 97 (or the upper surface of the tungsten film 104). In the process shown in FIG. 11 described later, patterning of the silicon nitride film 136 is performed to produce the cover insulation films 34-1 and 34-2.

That is, the silicon nitride film 136 is an insulation film that is base material of the cover insulation films 34-1 and 34-2. For example, the thickness of the silicon nitride film 136 may be 30 nm.

Then, in the process shown in FIGS. 11A, 11B, 11C, and 11D, the photolithographic technique and the anisotropic dry etching technique are used to perform patterning of the silicon nitride film 136. As a result, the cover insulation films 34-1 and 34-2 are formed at once: the cover insulation film 34-1 is disposed in the memory cell region E and made of the silicon nitride film 136, and the cover insulation film 34-2 is disposed in the peripheral circuit region F and made of the silicon nitride film 136.

At this time, the cover insulation film 34-1 is formed in such a way as to cover the upper surface of the tungsten film 104 corresponding to a formation region of the bit line 33. The cover insulation film 34-2 is formed in such a way as to cover the upper surface of the tungsten film 104 corresponding to a formation region of the gate electrode 109.

Then, the cover insulation films 34-1 and 34-2 are used as an etching mask, and anisotropic dry etching is performed. Accordingly, unnecessary portions of the metal laminated film shown in FIG. 10A (i.e., the first and second metal laminated films 97-1 and 97-2) and insulation film 125 are removed. As a result, the bit line 33, the peripheral circuit gate insulation film 108, and the gate electrode 109 are formed at once: the bit line 33 is disposed immediately below the cover insulation film 34-1 and made of the first metal laminated film 97-1 (metal laminated film 97); the peripheral circuit gate insulation film 108 is disposed at the center of the peripheral active region 18 and made of the insulation film 125; and the gate electrode 109 is disposed immediately below the cover insulation film 34-2 and made up of the step-reduction silicon film 115 (whose base material is the polysilicon film 127) and the second metal laminated film 97-2 (metal laminated film 97).

Accordingly, the bit line 33 is formed so as to extend in the X-direction shown in FIG. 1 and fill the bit contact hole 28A, with a lower end thereof connected to the upper surface 87a of the bit line impurity diffusion region 87.

Moreover, the gate electrode 109 is formed on the peripheral circuit gate insulation film 108 in such a way as to extend in the X-direction shown in FIG. 1.

In that manner, the bit line 33, which is made of the first metal laminated film 97-1, is formed so as to fill the bit contact hole 28A that exposes the upper surface 87a of the bit line impurity diffusion region 87. Therefore, without the use of a bit line contact plug made of silicon film, the bit line 33, which is made of the first metal laminated film 97-1 (i.e., the bit line that does not contain, among its components, a silicon film that is higher in resistance than metal), can be connected directly to the upper surface 87a of the bit line impurity diffusion region 87.

Therefore, even if the memory cell section 11 is miniaturized (or if the diameter of the opening of the bit contact hole 28A is made smaller), a rise in the resistance of the bit line 33 is curbed.

Moreover, as a metal film that constitutes the bottom layer of the first metal laminated film 97-1, the metal silicide film 101 (or, more specifically, a titanium silicide film, for example) is used. Therefore, even if the memory cell section 11 is miniaturized, a rise in the contact resistance between the bit line 33 and the bit line impurity diffusion region 87 (or a region where ion implantation of n-type impurities has been performed into the single crystal silicon substrate) can be curbed.

Moreover, on the upper surface 18a of the peripheral active region 18 and the upper surface of the element isolation region 15-2, the insulation film 125 and the polysilicon film 127 are sequentially laminated. Then, in the first interlayer insulation film 28 that covers the upper surface of the cell active region 17 and the upper surface of the element isolation region 15-1, the bit contact hole 28A is formed so as to expose the upper surface 87a of the bit line impurity diffusion region 87. Then, the metal laminated film 97 that covers the upper surface of the first interlayer insulation film 28 and the upper surface of the polysilicon film 127 is formed in such a way as to fill the bit contact hole 28A. Then, patterning of the metal laminated film 97 and polysilicon film 127 is performed to form the bit line 33 and the gate electrode 109 at once: the bit line 33 is made of the metal laminated film 97, and the gate electrode 109 is made up of the metal laminated film 97 and the step-reduction silicon film 115 whose base material is the polysilicon film 127. Therefore, the thickness of a portion of the bit line 33 that is disposed above the first interlayer insulation film 28 can be reduced by an amount equivalent to the thickness of the step-reduction silicon film 115.

Therefore, the parasitic capacitance of the bit line 33 can be reduced. Thus, it is possible to increase the accuracy of the operation of the semiconductor device 10 (or, more specifically, the accuracy of the operation of DRAM, for example).

Then, in the process shown in FIGS. 12A, 12B, 12C, and 12D, ion implantation of low-concentration n-type impurities into the peripheral active region 18 shown in FIG. 11A is performed by an ion implantation method using the cover insulation films 34-1 and 34-2 and the first interlayer insulation film 28 as a mask. As a result, the pair of low-concentration impurity diffusion regions 112 is formed.

More specifically, as the pair of low-concentration impurity diffusion regions 112, for example, LDD regions are formed.

Figure 12A:
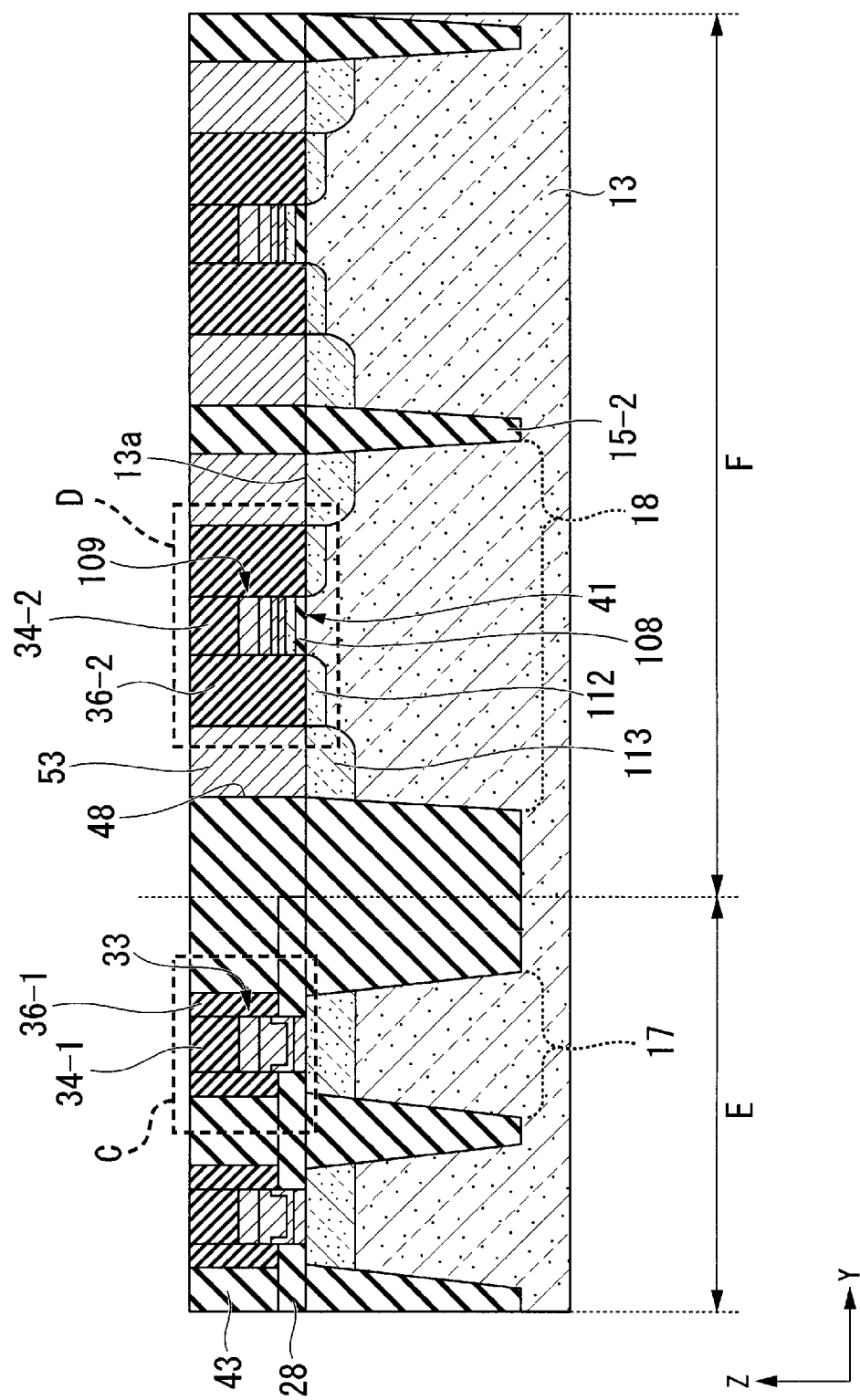
FIG. 12A is a cross-sectional view indicative of one process of the method of manufacturing the semiconductor device taken along the line A-A shown in FIG. 1.
Figure 12B:
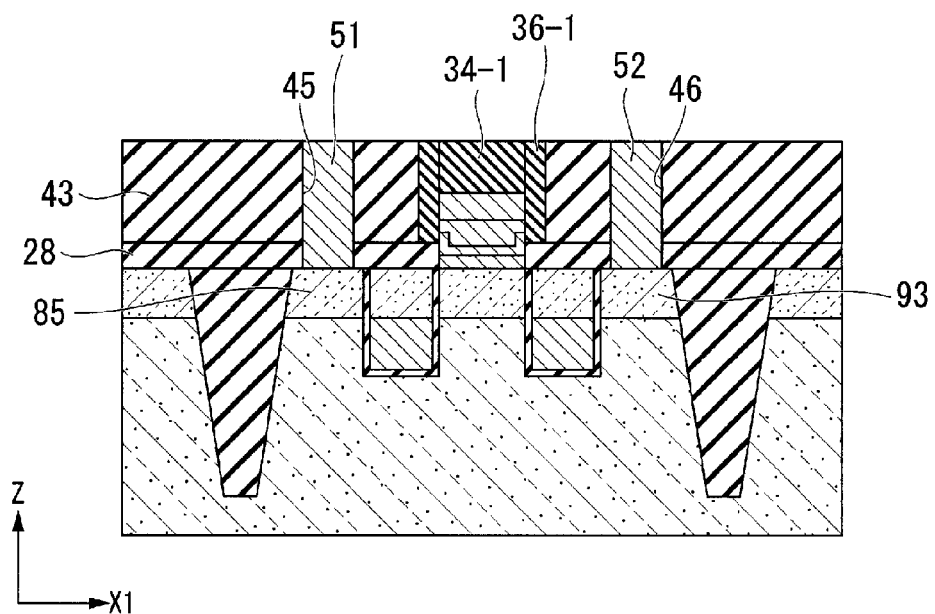
FIG. 12B is a cross-sectional view indicative of the one process of the method of manufacturing the semiconductor device taken along the line B-B shown in FIG. 1.
Figure 12C:
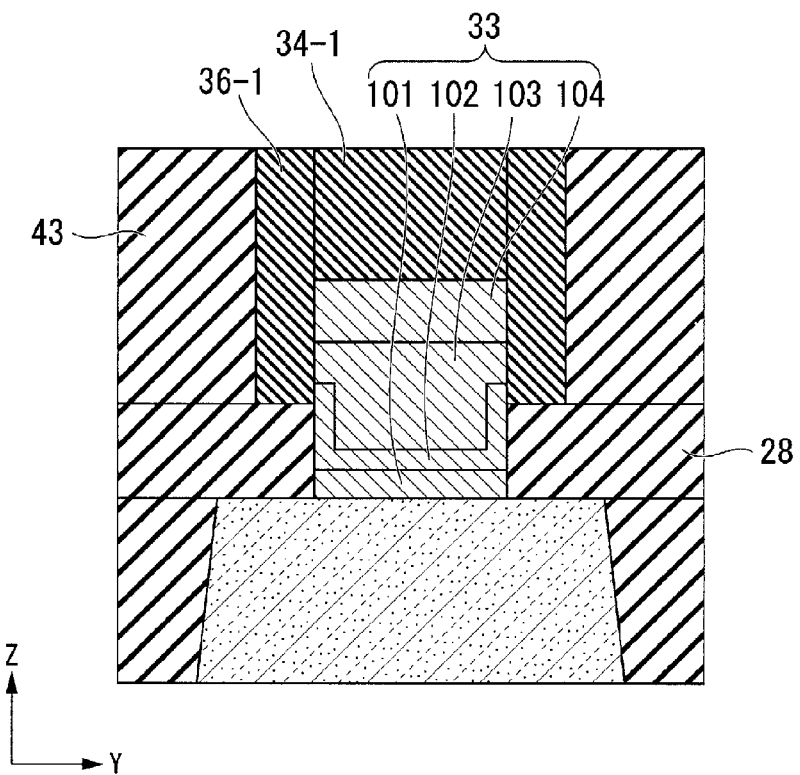
FIG. 12C is an enlarged cross-sectional view of a portion surrounded by a region D shown in FIG. 12A.
Figure 12D:
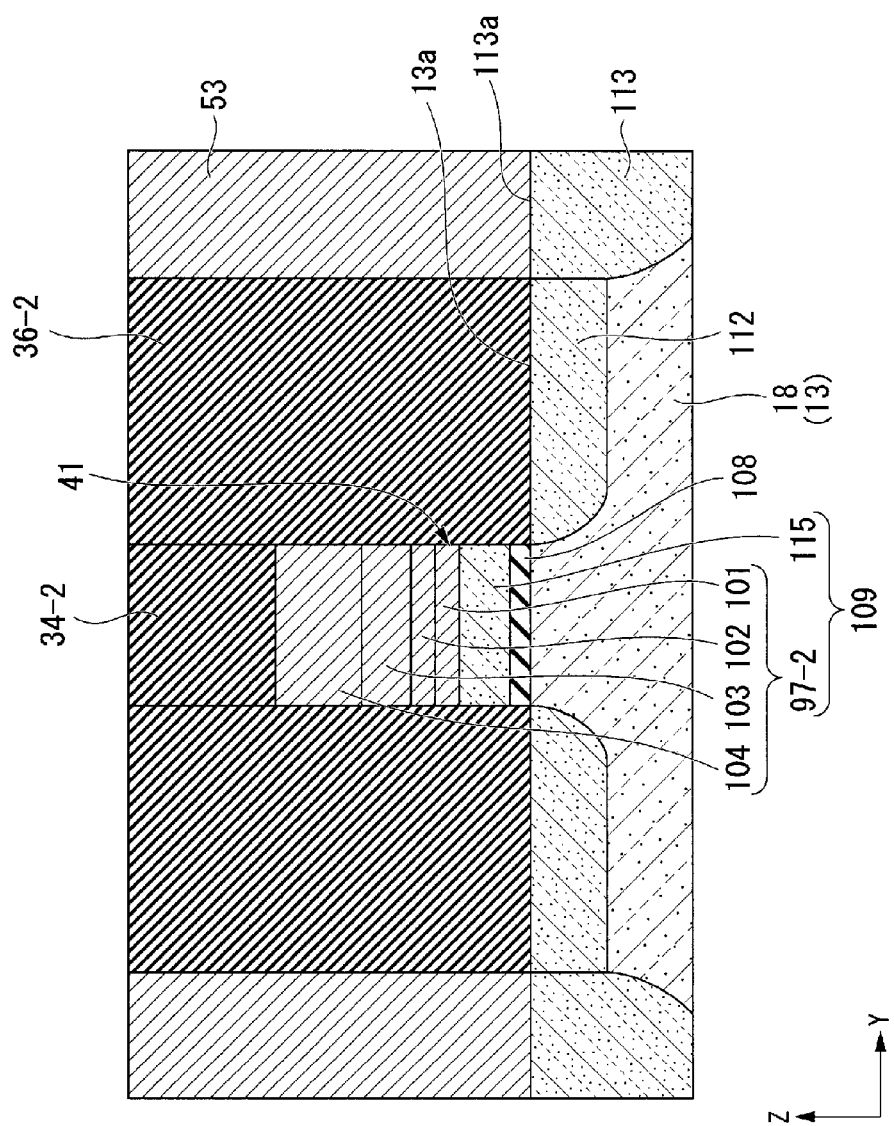
FIG. 12D is an enlarged cross-sectional view of a portion surrounded by a region C shown in FIG. 12A.

Incidentally, although not shown in the diagrams, at this stage, even in the peripheral active region 18 corresponding to the formation regions of the high-concentration impurity diffusion regions 113 shown in FIG. 12A, the low-concentration impurity diffusion regions 112 are formed.

Then, a well-known technique is used to form, at once, the sidewalls 36-1 and the sidewalls 36-2: the sidewalls 36-1 are placed on the first interlayer insulation film 28 and covers the side surfaces of the bit line 33 disposed above the upper surface of the first interlayer insulation film 28 and the cover insulation film 34-1, respectively; and the sidewalls 36-2 are placed on the low-concentration impurity diffusion regions 112 and covers the side surfaces of the gate electrode 109 and the cover insulation film 34-2, respectively.

More specifically, for example, after the pair of low-concentration impurity diffusion regions 112 is formed, a silicon nitride film (SiN film) is formed so as to cover the whole upper surface of the structure shown in FIG. 11A. After that, an anisotropic dry etching method is used to perform etching-back of the silicon nitride film to form the sidewalls 36-1 and 36-2.

Then, ion implantation of high-concentration n-type impurities is performed by using the cover insulation films 34-1 and 34-2, the first interlayer insulation film 28, and the sidewalls 36-2 as a mask. As a result, the pair of high-concentration impurity diffusion regions 113 is formed in portions of the peripheral active region 18 between the sidewalls 36-2 and the element isolation regions 15-2 in the Y-direction shown in FIG. 1 (i.e., the low-concentration impurity diffusion regions 112 (not shown) that are formed in portions corresponding to formation regions of the high-concentration impurity diffusion regions 113).

At this time, the high-concentration impurity diffusion regions 113 are formed in such a way as to be deeper than the depth of the low-concentration impurity diffusion regions 112 relative to the main surface 13a of the semiconductor substrate 13.

The pair of high-concentration impurity diffusion regions 113 is disposed in both end portions of the peripheral active region 18 in such a way that the peripheral circuit gate insulation film 108 is sandwiched therebetween in the Y-direction across the pair of low-concentration impurity diffusion region 112.

In that manner, in one peripheral active region 18, one peripheral circuit transistor 41 (planar transistor) is formed.

The peripheral circuit transistor 41 includes the peripheral circuit gate insulation film 108, the gate electrode 109, the pair of low-concentration impurity diffusion regions 112, and the pair of high-concentration impurity diffusion regions 113.

Then, a well-known technique is used to form the second interlayer insulation film 43: The second interlayer insulation film 43 fills the spaces formed between the sidewalls 36-1, between the sidewalls 36-1 and 36-2, and between the sidewalls 36-2, and the upper surface thereof is flush with the upper surfaces of the sidewalls 36-1 and 36-2.

More specifically, for example, the method described below is used to form the second interlayer insulation film 43.

First, the CVD method is used to form a silicon oxide film ($SiO_2$ film) that covers the memory cell region E and the peripheral circuit region F. Then, the CMP method is used to polish and thereby remove an unnecessary portion of silicon oxide film ($SiO_2$ film) formed above the upper surfaces of the cover insulation films 34-1 and 34-2 and the upper surfaces of the sidewalls 36-1 and 36-2. As a result, the second interlayer insulation film 43, which is made of the silicon oxide film ($SiO_2$ film), is formed.

At the above polishing step, the cover insulation films 34-1 and 34-2, which are made of the silicon nitride film (SiN film), and the sidewalls 36-1 and 36-2 are used as a stopper film for the polishing. Accordingly, the thickness of the second interlayer insulation film 43 can be accurately controlled.

Incidentally, instead of the silicon oxide film ($SiO_2$ film) formed by the CVD method, a coating-type insulation film (silicon oxide film ($SiO_2$ film)) formed by the SOG method may be used.

Then, the photolithographic technique and the anisotropic dry etching technique are used to form, at once, the following contact holes: the first contact hole 45, which passes through the first and second interlayer insulation films 28 and 43 located on the first capacitance impurity diffusion region 85; the first contact hole 46, which passes through the first and second interlayer insulation films 28 and 43 located on the second capacitance impurity diffusion region 93; and the second contact holes 48, which pass through the second interlayer insulation film 43 located on the high-concentration impurity diffusion regions 113, respectively.

In that manner, the first contact hole 45 is formed in such a way as to expose the upper surface of the first capacitance impurity diffusion region 85. The first contact hole 46 is formed in such a way as to expose the upper surface of the second capacitance impurity diffusion region 93.

Each of the second contact hole 48 is formed in such a way as to expose the upper surface of the corresponding high-concentration impurity diffusion region 113.

Then, a well-known technique is used to form the following contact plugs at once: the capacitance contact plug 51, which is placed in the first contact hole 45 and the lower end of which is in contact with the upper surface of the first capacitance impurity diffusion region 85; the capacitance contact plug 52, which is placed in the first contact hole 46 and the lower end of which is in contact with the upper surface of the second capacitance impurity diffusion region 93; and the first contact plugs 53, which are placed in the second contact holes 48 and the lower ends of which are in contact with the upper surfaces of the high-concentration impurity diffusion regions 113, respectively.

At this time, the capacitance contact plugs 51 and 52 and the first contact plugs 53 are formed in such a way that the upper surfaces of the capacitance contact plugs 51 and 52 and the upper surfaces of the first contact plugs 53 are flush with the upper surface of the second interlayer insulation film 43.

Figure 13A:
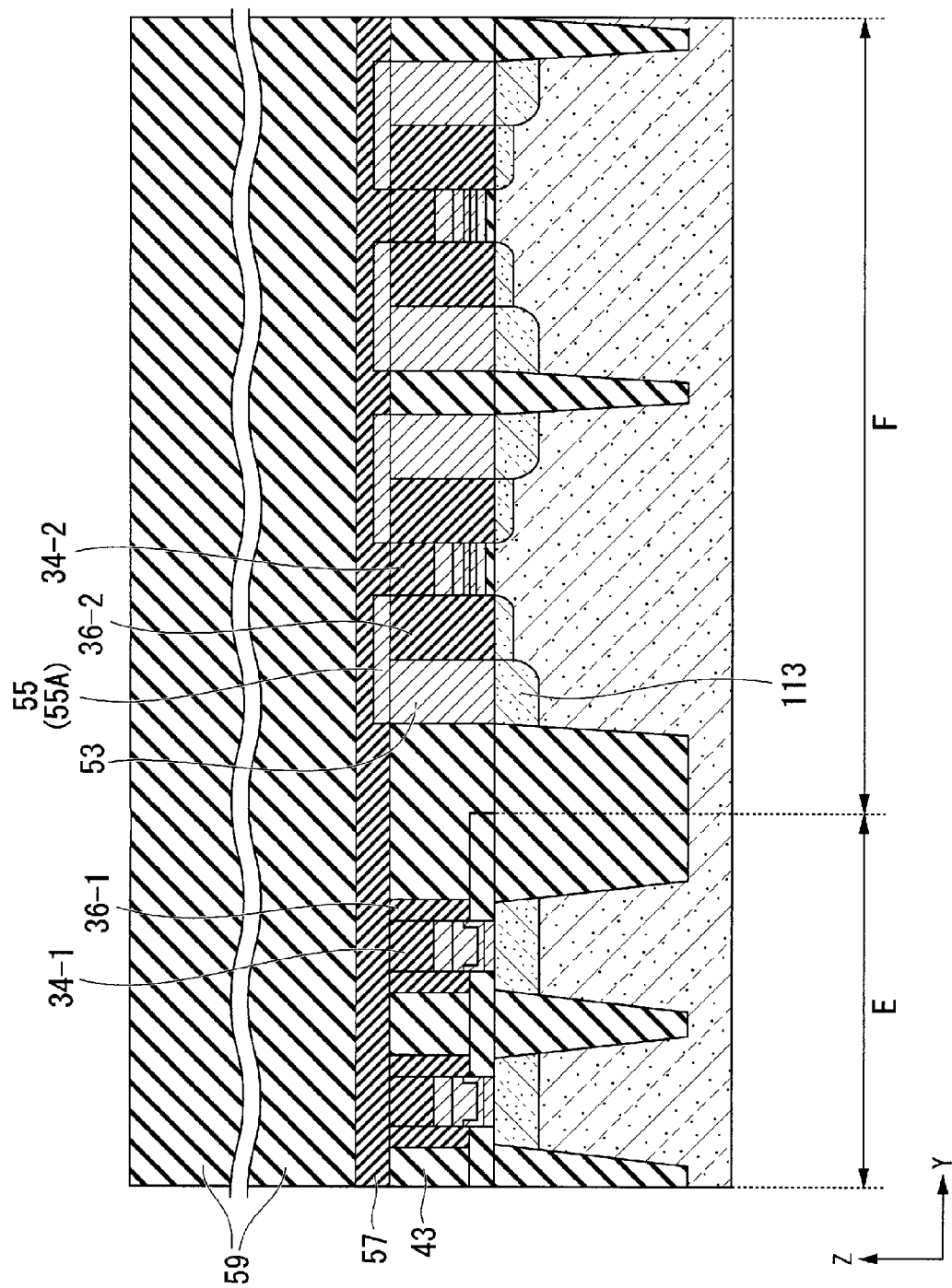
FIG. 13A is a cross-sectional view indicative of one process of the method of manufacturing the semiconductor device taken along the line A-A shown in FIG. 1.
Figure 13B:
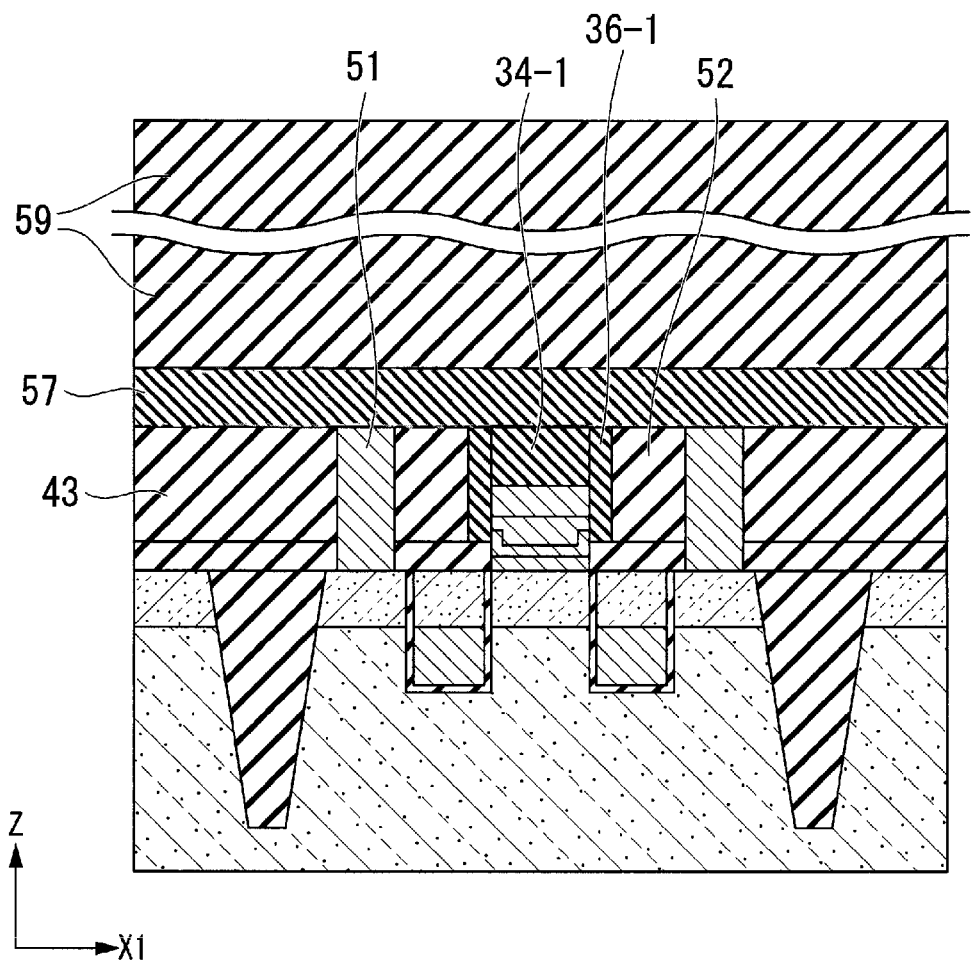
FIG. 13B is a cross-sectional view indicative of the one process of the method of manufacturing the semiconductor device taken along the line B-B shown in FIG. 1.

Then, in the process shown in FIGS. 13A and 13B, a well-known technique is used to form, on the second interlayer insulation film 43 disposed in the peripheral circuit region F, the first wiring pattern 55 that includes the wiring section (not shown) and the pad section 55A connected to the upper end of the first contact plug 53.

Then, a well-known technique (e.g. CVD method) is used to form the stopper film 57, which covers the upper surface of the first interlayer insulation film 43, the upper surfaces of the cover insulation films 34-1 and 34-2, the upper surface of the sidewalls 36-1, and the first wiring pattern 55.

The stopper film 57 is an insulation film that functions as a stopper film when anisotropic dry etching of the third and fourth interlayer insulation films 59 and 66 (see FIG. 2) is performed.

Therefore, the stopper film 57 may be an insulation film that is less likely to be etched during the anisotropic dry etching under conditions for etching the third and fourth interlayer insulation films 59 and 66.

More specifically, if a silicon oxide film ($SiO_2$ film) is used as the third and fourth interlayer insulation films 59 and 66, what is formed as the stopper film 57 may be a silicon nitride film (SiN film), for example.

Then, a well-known technique is used to form the third interlayer insulation film 59 that covers the upper surface of the stopper film 57. More specifically, for example, the CVD method is used to form a silicon oxide film ($SiO_2$ film). In this manner, the third interlayer insulation film 59, which is made of the silicon oxide film ($SiO_2$ film), is formed.

Incidentally, instead of the silicon oxide film ($SiO_2$ film) formed by the CVD method, a coating-type insulation film (silicon oxide film ($SiO_2$ film)) formed by the SOG method may be used to form the third interlayer insulation film 59.

Figure 14A:
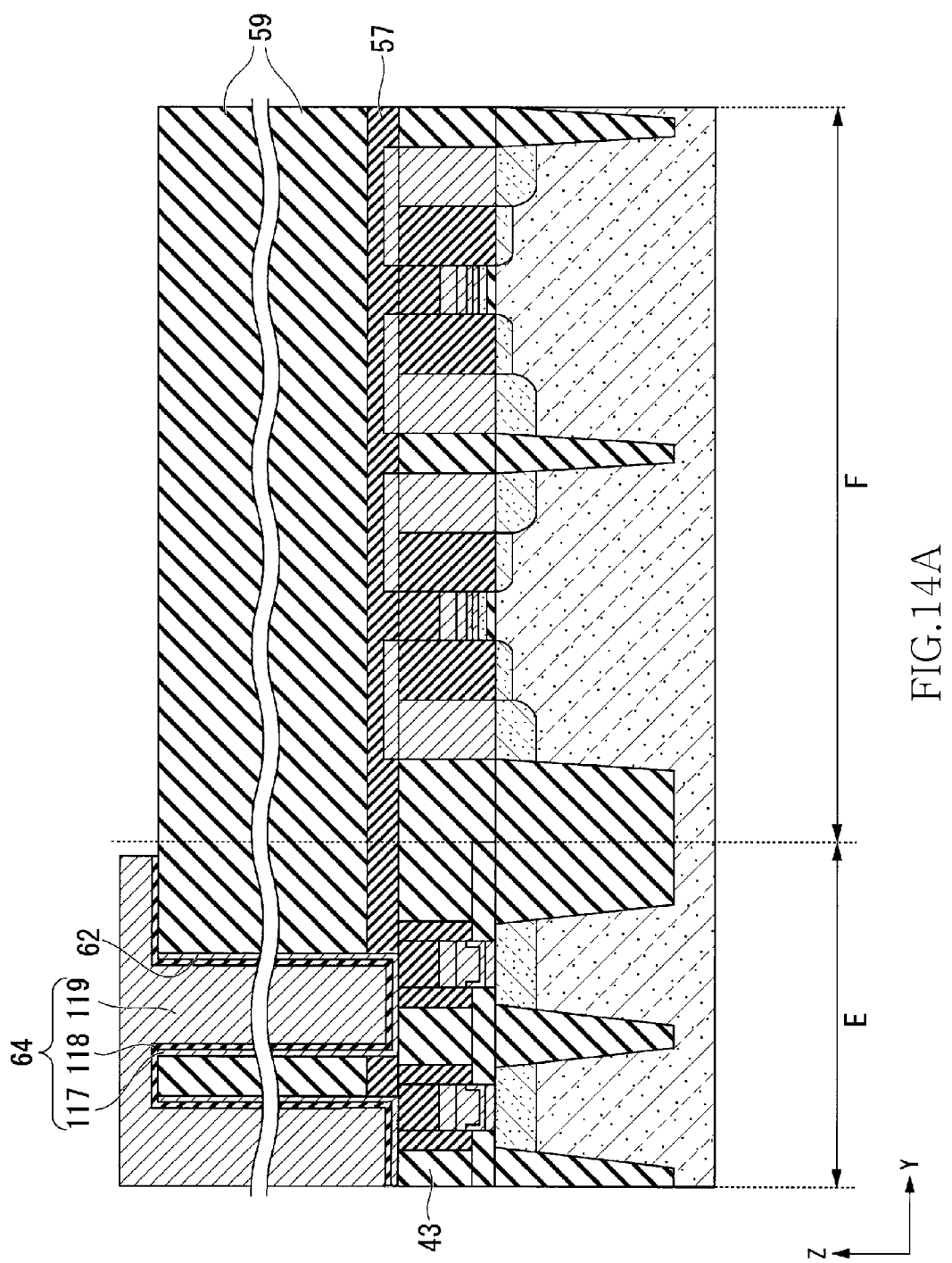
FIG. 14A is a cross-sectional view indicative of one process of the method of manufacturing the semiconductor device taken along the line A-A shown in FIG. 1.
Figure 14B:
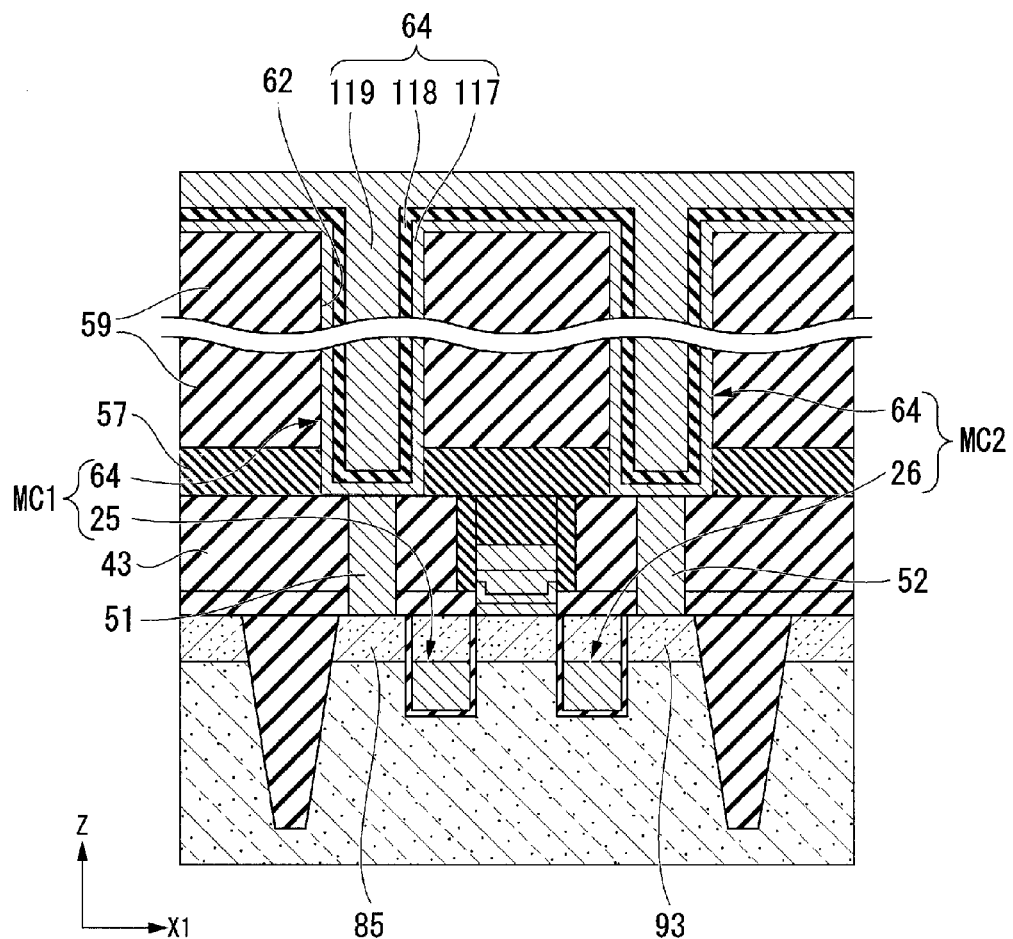
FIG. 14B is a cross-sectional view indicative of the one process of the method of manufacturing the semiconductor device taken along the line B-B shown in FIG. 1.
Figure 15:
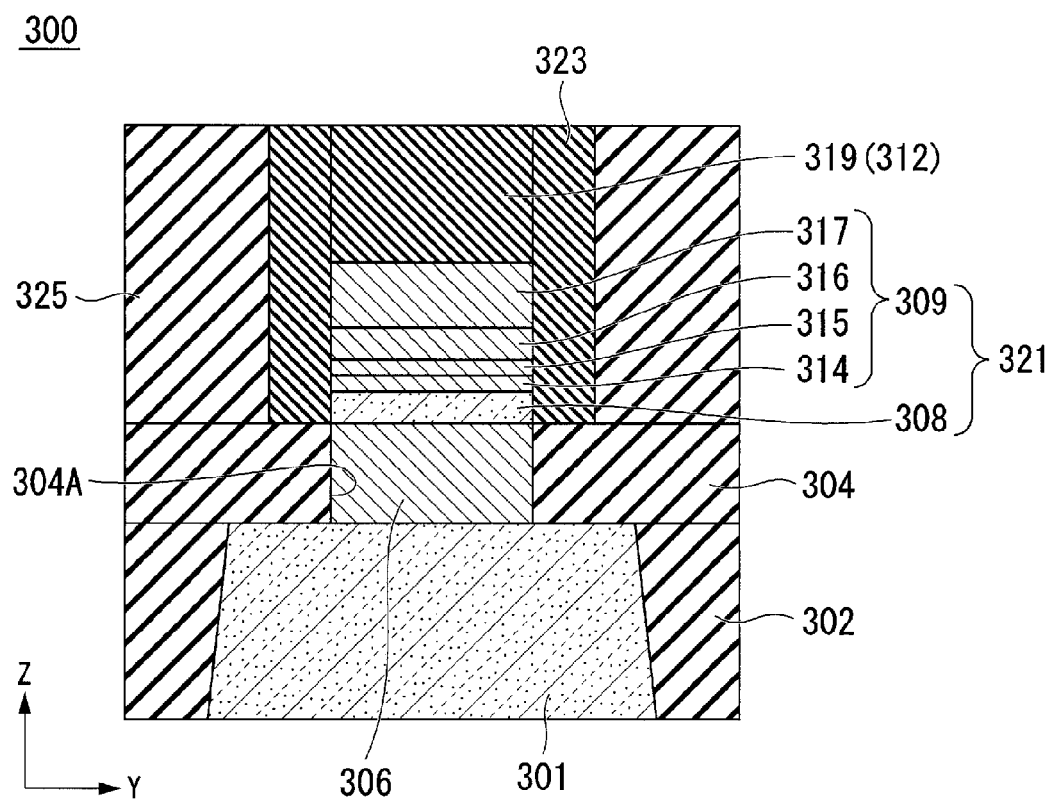
FIG. 15 is a cross-sectional view illustrating a process of manufacturing a structure (or a structure containing bit lines) that is disposed on the memory cell region.

Then, in the process shown in FIGS. 14A and 14B, the photolithographic technique and the anisotropic dry etching are used to form the cylinder holes 62, which pass through the stopper film 57 and third interlayer insulation film 59 disposed on the capacitance contact plugs 51 and 52, respectively.

At this time, the cylinder holes 62 are formed in such a way as to expose the upper-end surface of the capacitance contact plug 51 and the upper-end surface of the capacitance contact plug 52, respectively.

More specifically, for example, the method described below is used to form the cylinder hall 62.

First, the photolithographic technique is used to form an etching mask (not shown) on the third interlayer insulation film 59. Then, by using the conditions under which the silicon oxide film ($SiO_2$ film) is likely to be etched and the silicon nitride film (SiN film) is unlikely to be etched (i.e., the conditions under which the silicon oxide film ($SiO_2$ film) is selectively etched), etching of the third interlayer insulation film 59 by anisotropic dry etching is performed.

At this time, the stopper film 57 made of silicon nitride film (SiN film) functions as a stopper film during the anisotropic dry etching. Therefore, an over-etching time can be made longer. Therefore, it is possible to ensure that, on the semiconductor substrate 13, the upper surface of the stopper film 57 is exposed.

Then, by using the conditions under which the silicon nitride film (SiN film) is likely to be etched and the silicon oxide film ($SiO_2$ film) is unlikely to be etched (i.e., the conditions under which the silicon nitride film (SiN film) is selectively etched), etching of the thin stopper film 57 by anisotropic dry etching is performed, thereby forming a plurality of cylinder holes 62.

Then, a well-known technique is used to form the lower electrode 117 that covers the inner surface of the cylinder hole 62 and which is formed into the shape of a crown (crown shape). Therefore, the lower electrode 117 formed in the cylinder hole 62 that exposes the upper-end surface of the capacitance contact plug 51 is connected to the capacitance contact plug 51, and is electrically connected to the first capacitance impurity diffusion region 85 via the capacitance contact plug 51.

The lower electrode 117 formed in the cylinder hole 62 that exposes the upper-end surface of the capacitance contact plug 52 is connected to the capacitance contact plug 52, and is electrically connected to the second capacitance impurity diffusion region 93 via the capacitance contact plug 52.

The lower electrode 117 is formed in such a way as to have a thickness that does not fully fill the cylinder holes 62. The metal film that serves as base material of the lower electrode 117 may be a titanium nitride film (TiN film), for example. The titanium nitride film (TiN film) can be formed by such methods as CVD method or ALD (Atomic Layer Deposition) method, for example.

Then, a well-known technique is used to form the capacitance insulation film 118 that covers the upper surface of the lower electrode 117 and the upper surface of the third interlayer insulation film 59. At this time, the capacitance insulation film 118 is formed in such a way as to have a thickness that does not fully fill the cylinder holes 62 through the lower electrode 117.

For example, the capacitance insulation film 118 may be a hafnium oxide film ($HfO_2$ film), a zirconium oxide film ($ZrO_2$ film), an aluminum oxide film ($Al_2O_3$ film), a strontium titanate film ($SrTiO_3$ film), a laminated film of those films, or the like.

Then, a well-known technique is used to form the upper electrode 119 that covers the surface of the capacitance insulation film 118 and which fills the cylinder holes 62 through the capacitance insulation film 118 and the lower electrode 117. At this time, the upper electrode 119 is formed in such a way that the upper surface thereof is flat.

The metal film that constitutes the upper electrode 119 may be a titanium nitride film (TiN film), for example. The titanium nitride film (TiN film) can be formed by CVD method or ALD method, for example.

In that manner, in each cylinder hole 62, the capacitor 64, which includes the lower electrode 117, the capacitance insulation film 118, and the upper electrode 119, is formed. Moreover, the first memory cell MC1 and the second memory cell MC2 are formed (see FIG. 3): the first memory cell MC1 includes the first transistor 25 and the capacitor 64 formed above the capacitance contact plug 51, and the second memory cell MC2 includes the second transistor 26 and the capacitor 64 formed above the capacitance contact plug 52.

Among the capacitors 64, the capacitor 64 formed above the capacitance contact plug 51 is electrically connected to the first transistor 25 via the capacitance contact plug 51 (see FIG. 3).

Among the capacitors 64, the capacitor 64 formed above the capacitance contact plug 52 is electrically connected to the second transistor 26 via the capacitance contact plug 52 (see FIG. 3).

Figure 2:
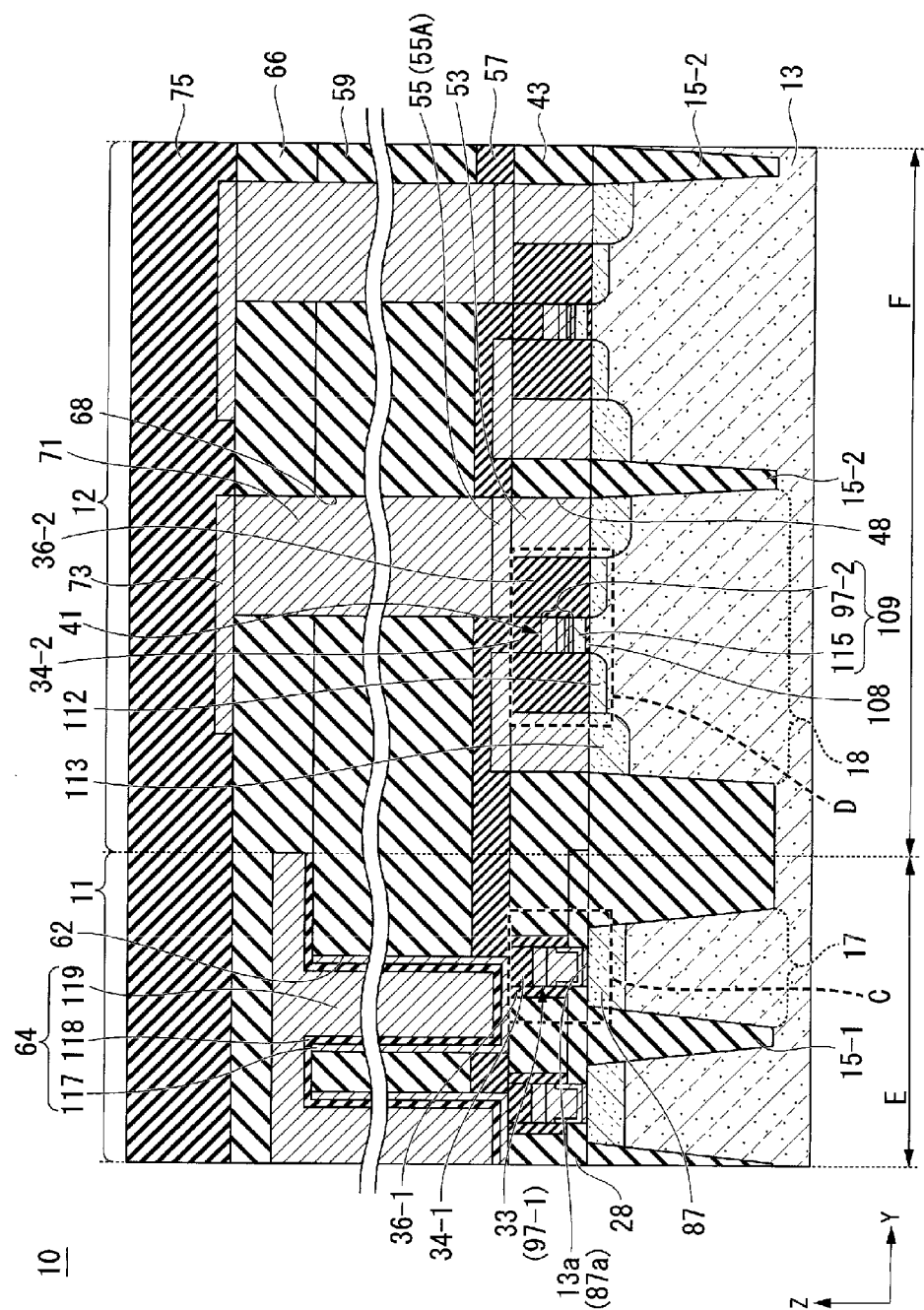
FIG. 2 is a cross-sectional view of the semiconductor device taken along a line A-A shown in FIG. 1.

In the subsequent process, as shown in FIGS. 2 and 3, a well-known technique is used to form, on the upper surface of the third interlayer insulation film 59, the fourth interlayer insulation film 66 that covers the upper electrode 119 and the upper surface of which is flat.

More specifically, for example, the method described below may be used to form the fourth interlayer insulation film 66. First, the CVD method is used to form a silicon oxide film ($SiO_2$ film) that serves as base material of the fourth interlayer insulation film 66. Then, the CMP method is used to polish and thereby remove an upper portion of the silicon oxide film ($SiO_2$ film). In this manner, what is formed is the fourth interlayer insulation film 66 that is made of the silicon oxide film ($SiO_2$ film) and the upper surface of which is flat.

Incidentally, instead of the silicon oxide film ($SiO_2$ film) formed by CVD method, a coating-type insulation film (silicon oxide film ($SiO_2$ film)) may be formed by SOG method as base material of the fourth interlayer insulation film 66.

Then, the photolithographic technique and the anisotropic dry etching technique are used to remove the third and fourth interlayer insulation films 59 and 66 located above the pad section 55A. As a result, the third contact hole 68 is formed so as to expose the upper surface of the pad section 55A.

Then, a well-known technique (which is similar to the method of forming the capacitance contact plugs 51 and 52 and the first contact plug 53, for example) is used to form the second contact plug 71 that fills the third contact hole 68 and the lower end of which is connected to the pad section 55A of the first wiring pattern 55.

At this time, the second contact plug 71 is formed in such a way that the upper surface thereof is flush with the upper surface of the fourth interlayer insulation film 66.

The second contact plug 71 is electrically connected to the high-concentration impurity diffusion regions 113 of the peripheral circuit transistor 41 via the first wiring pattern 55.

Then, a well-known technique is used to form, on the upper surface of the fourth interlayer insulation film 66 located in the peripheral circuit region F, the second wiring pattern 73 that is connected to the upper end of the second contact plug 71.

Accordingly, the second wiring pattern 73 is electrically connected to the peripheral circuit transistor 41 via the second contact plug 71.

Then, a well-known technique is used to form, on the upper surface of the fourth interlayer insulation film 66, the protective insulation film 75 that covers the second wiring pattern 73. The protective insulation film 75 may be an insulation film made of polyimide resin, for example.

In that manner, the semiconductor device 10 is produced in such a way as to have the memory cell section 11, which is disposed in the memory cell region E, and the peripheral circuit section 12, which is disposed in the peripheral circuit region F.

According to the manufacturing method of the semiconductor device of the present embodiment, the bit line 33, which is made of the metal laminated film 97, is formed in such away as to fill the bit contact hole 28A, which exposes the upper surface 87a of the bit line impurity diffusion region 87. Therefore, without the use of a bit line contact plug made of silicon film, the bit line 33, which is made of the metal laminated film 97 (i.e., the bit line that does not contain, among its components, a silicon film that is higher in resistance than metal), can be connected directly to the upper surface 87a of the bit line impurity diffusion region 87.

Therefore, even if the memory cell section 11 is miniaturized (or if the diameter of the opening of the bit contact hole 28A is made smaller), a rise in the resistance of the bit line 33 is curbed.

Moreover, as a metal film that constitutes the bottom layer of the metal laminated film 97, the metal silicide film 101 (or, more specifically, a titanium silicide film, for example) is formed. Therefore, even if the memory cell section 11 is miniaturized, a rise in the contact resistance between the bit line 33 and the bit line impurity diffusion region 87 (or a region where ion implantation of n-type impurities has been performed into the single crystal silicon substrate) can be curbed.

Moreover, on the upper surface 18a of the peripheral active region 18 and the upper surface of the element isolation region 15-2, the insulation film 125 and the polysilicon film 127 are sequentially laminated. Then, in the first interlayer insulation film 28 that covers the upper surface of the cell active region 17 and the upper surface of the element isolation region 15-1, the bit contact hole 28A is formed so as to expose the upper surface 87a of the bit line impurity diffusion region 87. Then, the metal laminated film 97, which covers the upper surface of the first interlayer insulation film 28 and the upper layer of the polysilicon film 127, is formed so as to fill the bit contact hole 28A. After that, patterning of the metal laminated film 97 and the polysilicon film 127 is performed. As a result, the bit line 33, which is made of the metal laminated film 97, and the gate electrode 109, which is made up of the metal laminated film 97 and the step-reduction silicon film 115 whose base material is the polysilicon film 127, are formed at once. Therefore, the thickness of a portion of the bit line 33 that is disposed on the first interlayer insulation film 28 can be reduced by an amount equivalent to the thickness of the step-reduction silicon film 115.

Therefore, the parasitic capacitance of the bit line 33 can be reduced. Thus, it is possible to increase the accuracy of the operation of the semiconductor device 10 (or, more specifically, the accuracy of the operation of DRAM, for example).

The preferred embodiment of the present invention has been described in detail. However, the present invention is not limited to that specific embodiment. Within the scope of the present invention described in the appended claims, various modifications and changes may be made.

In addition, while not specifically claimed in the claim section, the applicant reserves the right to include in the claim section of the application at any appropriate time the following methods:

A1. A method of manufacturing a semiconductor device, comprising:

forming an insulation film that serves as base material of a peripheral circuit gate insulation film that constitutes a peripheral circuit transistor in a peripheral circuit region of a main surface of a semiconductor substrate having a cell active region and the peripheral circuit region;

forming a silicon film that serves as base material of a step-reduction silicon film on the insulation film;

forming a first interlayer insulation film that covers the cell active region and an upper surface of the silicon film;

performing anisotropic dry etching to form a bit contact hole that passes through the first interlayer insulation film and exposes a portion of the upper surface of the cell active region while removing the first interlayer insulation film disposed above the silicon film;

forming a metal laminated film that covers the upper surface of the first interlayer insulation film and the upper surface of the silicon film in such a way as to fill the bit contact hole;

forming, at once, a first cover insulation film that is disposed on the metal laminated film located in the cell active region and functions as an etching mask, and a second cover insulation film that is disposed on the metal laminated film located in the peripheral circuit region and functions as an etching mask; and performing patterning of the metal laminated film and silicon film disposed in the cell active region and peripheral circuit region by anisotropic dry etching through the first and second cover insulation films, thereby forming, at once, a bit line that is made of the metal laminated film disposed below the first cover insulation film and fills the bit contact hole, and a gate electrode of the peripheral circuit transistor that is made of the metal laminated film disposed below the second cover insulation film and the step-reduction silicon film.

A2. The method of manufacturing the semiconductor device as described in A1, wherein the forming the metal laminated film includes forming a metal silicide film on an upper surface of the cell active region exposed through the bit contact hole and on an upper surface of the silicon film formed in the peripheral circuit region.

A3. The method of manufacturing the semiconductor device as described in A2, wherein the thickness of the insulation film, the thickness of the silicon film, the thickness of the first interlayer insulation film, and the thickness of the metal silicide film are adjusted in such a way that an upper surface of the metal silicide film formed on the silicon film is flush with an upper surface of the first interlayer insulation film formed in the cell active region.

A4. The method of manufacturing the semiconductor device as described in any one of A1 to A3, wherein the peripheral circuit gate insulation film is formed by patterning of the insulation film during the anisotropic dry etching that is performed to form the gate electrode.

A5. The method of manufacturing the semiconductor device as described in anyone of A1 to A4, further comprising:

forming a groove that extends in a direction crossing a direction in which the cell active region extends and divides an upper portion of the cell active region before the metal silicide film is formed; and forming a transistor including a gate insulation film, which covers an inner surface of the groove formed in the cell active region, an embedded gate electrode, which is disposed so as to fill a lower portion of the groove through the gate insulation film, a capacitance impurity diffusion region, which is disposed in the cell active region that constitutes one side surface of the groove, and a bit line impurity diffusion region, which is disposed in the cell active region that constitutes the other side surface of the groove, wherein the bit contact hole is formed so as to expose an upper surface of the bit line impurity diffusion region.

A6. The method of manufacturing the semiconductor device as described in A5, wherein:

at the forming the groove, the two grooves are formed so as to divide the cell active region into three; and at the forming the transistor, the two transistors are formed in the cell active region, and the bit line impurity diffusion region is formed in the cell active region located between the two grooves.

A7. The method of manufacturing the semiconductor device as described in any one of A2 to A6, wherein at the forming the metal silicide film, a titanium silicide film is formed as the metal silicide film.

A8. The method of manufacturing the semiconductor device as described in any one of A2 to A7, wherein at the forming the metal laminated film, after the formation of the metal silicide film, a titanium nitride film, a tungsten silicide film, and a tungsten film are sequentially laminated.

A9. The method of manufacturing the semiconductor device as described in any one of A1 to A8, wherein a polysilicon film is formed as the silicon film.

A10. The method of manufacturing the semiconductor device as described in any one of A5 to A9, comprising:

forming a capacitance contact plug whose upper end is disposed above the bit line on the capacitance impurity diffusion region; and forming a capacitor on the capacitance contact plug.

A11. The method of manufacturing the semiconductor device as described in any one of A1 to A10, wherein the semiconductor substrate includes a memory cell region where a plurality of the cell active regions are formed; and the method includes a step of forming, in the memory cell region, an element isolation region that is deeper than the groove and defines a plurality of the cell active regions.

A12. The method of manufacturing the semiconductor device as described in any one of A1 to A11, wherein the peripheral circuit region includes a peripheral active region where a plurality of the peripheral circuit transistors are formed, and the method further comprising forming an element isolation region that defines a plurality of the peripheral active regions in the peripheral circuit region.

A13. The method of manufacturing the semiconductor device as described in A12, further comprising forming a planar transistor in the peripheral active region as the peripheral circuit transistor that contains the peripheral circuit gate insulation film and the gate electrode as components.

What is claimed is:

1. A semiconductor device comprising:
a semiconductor substrate including a memory cell region and a peripheral circuit region arranged around the memory cell region;
an element isolation region formed in the memory cell region and the peripheral circuit region;
a cell active region defined by the element isolation region formed in the memory cell region;
a first interlayer insulation film disposed on the cell active region, the first interlayer insulation film having a bit contact hole passing therethrough to expose a portion of an upper surface of the cell active region; and
a bit line having a first metal laminated film, the bit line being disposed on the first interlayer insulation film and filling the bit contact hole with multiple different composition metals, the bit contact hole being devoid of any silicon film.

2. A semiconductor device comprising:
a semiconductor substrate including a memory cell region and a peripheral circuit region arranged around the memory cell region;
an element isolation region formed in the memory cell region and the peripheral circuit region;
a cell active region defined by the element isolation region formed in the memory cell region;
a first interlayer insulation film disposed on the cell active region, the first interlayer insulation film having a bit contact hole passing therethrough to expose a portion of an upper surface of the cell active region;
a bit line having a first metal laminated film, the bit line being disposed on the first interlayer insulation film so as to fill the bit contact hole;
the first metal laminated film located at the bit contact hole including a four-layer laminated film in which a metal silicide film, a titanium nitride film, a tungsten silicide film, and a tungsten film are sequentially disposed, and
the bit contact hole being filled with at least the metal silicide film and the titanium nitride film.

3. The semiconductor device as claimed in claim 1, wherein the bit contact hole is positioned below an upper surface of the first interlayer insulation film.

4. The semiconductor device as claimed in claim 2, wherein the bit contact hole is filled with the metal silicide film, the titanium nitride film, and the tungsten silicide film.

5. The semiconductor device as claimed in claim 2, wherein the metal silicide film is disposed only on an upper surface of the cell active region located in the bit contact hole.

6. The semiconductor device as claimed in claim 2, wherein at least the tungsten film is not disposed in the bit contact hole.

7. A semiconductor device comprising:
a semiconductor substrate including a memory cell region and a peripheral circuit region arranged around the memory cell region;
an element isolation region formed in the memory cell region and the peripheral circuit region;
a cell active region defined by the element isolation region formed in the memory cell region;
a first interlayer insulation film disposed on the cell active region, the first interlayer insulation film having a bit contact hole passing therethrough to expose a portion of an upper surface of the cell active region;
a bit line having a first metal laminated film, the bit line being disposed on the first interlayer insulation film so as to fill the bit contact hole;
the first metal laminated film disposed on the first interlayer insulation film including a three-layer laminated film in which a titanium nitride film, a tungsten silicide film, and a tungsten film are sequentially laminated.

8. A semiconductor device comprising:
a semiconductor substrate including a memory cell region and a peripheral circuit region arranged around the memory cell region;
an element isolation region formed in the memory cell region and the peripheral circuit region;
a cell active region defined by the element isolation region formed in the memory cell region;
a first interlayer insulation film disposed on the cell active region, the first interlayer insulation film having a bit contact hole passing therethrough to expose a portion of an upper surface of the cell active region;
a bit line having a first metal laminated film, the bit line being disposed on the first interlayer insulation film so as to fill the bit contact hole;
a peripheral active region defined by the element isolation region formed in the peripheral circuit region; and
a peripheral circuit transistor provided in the peripheral active region, wherein
the peripheral circuit transistor is of a planar type including a peripheral circuit gate insulation film disposed at a center of an upper surface of the peripheral active region, a step-reduction silicon film disposed on the peripheral circuit gate insulation film, and a gate electrode made of a second metal laminated film disposed on the step-reduction silicon film, and
an upper surface of the step-reduction silicon film is substantially flush with an upper surface of the first interlayer insulation film disposed in the memory cell region.

9. The semiconductor device as claimed in claim 8, wherein the first and second metal laminated films have substantially the same laminated structure.

10. The semiconductor device as claimed in claim 8, wherein each of the first and second metal laminated films has a lowermost metal films that includes a metal silicide.

11. The semiconductor device as claimed in claim 10, wherein each of the first and second metal laminated films has a laminated film in which the metal silicide film, a titanium nitride film, a tungsten silicide film, and a tungsten film are sequentially laminated.

12. The semiconductor device as claimed in claim 10, wherein the metal silicide film includes a titanium silicide.

13. The semiconductor device as claimed in claim 8, wherein the step-reduction silicon film includes a polysilicon.

14. A semiconductor device comprising:
a semiconductor substrate including a memory cell region and a peripheral circuit region arranged around the memory cell region;
an element isolation region formed in the memory cell region and the peripheral circuit region;
a cell active region defined by the element isolation region formed in the memory cell region;
a first interlayer insulation film disposed on the cell active region, the first interlayer insulation film having a bit contact hole passing therethrough to expose a portion of an upper surface of the cell active region;
a bit line having a first metal laminated film, the bit line being disposed on the first interlayer insulation film so as to fill the bit contact hole;
a groove crossing the cell active region so as to divide an upper portion of the cell active region; and
a transistor including a gate insulation film covering an inner surface of the groove formed in the cell active region, an embedded gate electrode disposed so as to fill a lower portion of the groove with an intervention of the gate insulation film, a capacitance impurity diffusion region disposed in the cell active region positioned at one side of the groove, and a bit line impurity diffusion region disposed in the cell active region positioned at the other side of the groove.

15. The semiconductor device as claimed in claim 14, wherein the bit contact hole exposes an upper surface of the bit line impurity diffusion region.

16. The semiconductor device as claimed in claim 14, wherein
   a couple of the grooves are disposed so as to divide the upper portion of the cell active region into three,
   a couple of the transistors are formed in a direction in which the cell active region extends, and
   the bit line impurity diffusion region is disposed in the cell active region located between the couple of grooves.

17. The semiconductor device as claimed in claim 16, wherein a couple of the capacitance impurity diffusion regions are disposed in one end portion of the cell active region between one of the couple of grooves and the element isolation region and in the other end portion of the cell active region between the other one of the couple of grooves and the element isolation region, respectively.

18. The semiconductor device as claimed in claim 14, further comprising:
   a capacitance contact plug provided on the capacitance impurity diffusion region, an upper end of the capacitance contact plug being disposed above the bit line; and
   a capacitor disposed on the capacitance contact plug.

19. A semiconductor device comprising:
   a semiconductor substrate including a memory cell region and a peripheral circuit region arranged around the memory cell region;
   an element isolation region formed in the memory cell region and the peripheral circuit region;
   a cell active region defined by the element isolation region formed in the memory cell region;
   a first interlayer insulation film disposed on the cell active region, the first interlayer insulation film having a bit contact hole passing therethrough to expose a portion of an upper surface of the cell active region; and
   a bit line having a first metal laminated film, the bit line being disposed on the first interlayer insulation film and filling the bit contact hole with multiple different composition metals, the bit contact hole being devoid of polysilicon.

* * * * *